United States Patent [19]
Brown

[11] Patent Number: 5,317,287
[45] Date of Patent: May 31, 1994

[54] LOW-GAIN, RANGE PROGRAMMABLE, TEMPERATURE COMPENSATED VOLTAGE CONTROLLED RING OSCILLATOR

[75] Inventor: Michael A. Brown, San Jose, Calif.

[73] Assignee: National Semiconductor Corporation, Santa Clara City, Calif.

[21] Appl. No.: 914,977

[22] Filed: Jul. 16, 1992

[51] Int. Cl.⁵ .......................... H03B 5/04; H03L 1/02; H03L 7/099

[52] U.S. Cl. .......................... 331/57; 331/25; 331/36 C; 331/108 B; 331/176; 331/177 V

[58] Field of Search .............. 331/25, 34, 36 R, 36 C, 331/57, 108 B, 176, 177 R, 177 V

[56] References Cited
U.S. PATENT DOCUMENTS 3,978,431  8/1976  Lattin .......................... 331/57 X
4,547,749  10/1985  Kuo .......................... 331/57
5,180,995  1/1993  Hayashi et al. .......................... 331/57

Primary Examiner—Siegfried H. Grimm
Attorney, Agent, or Firm—Limbach & Limbach

[57] ABSTRACT

A multirange low-gain voltage controlled ring oscillator generates a substantially temperature-independent oscillator signal. Each frequency range is formed by utilizing a selected value of a voltage variable resistance in each stage of the ring oscillator. The oscillator signal is made to be substantially temperature-independent by utilizing a substantially temperature-independent constant current source to source a fixed current through the variable resistance and a temperature varying current which sinks and sources additional current to the oscillating circuit as temperature rises and falls, respectively.

6 Claims, 22 Drawing Sheets

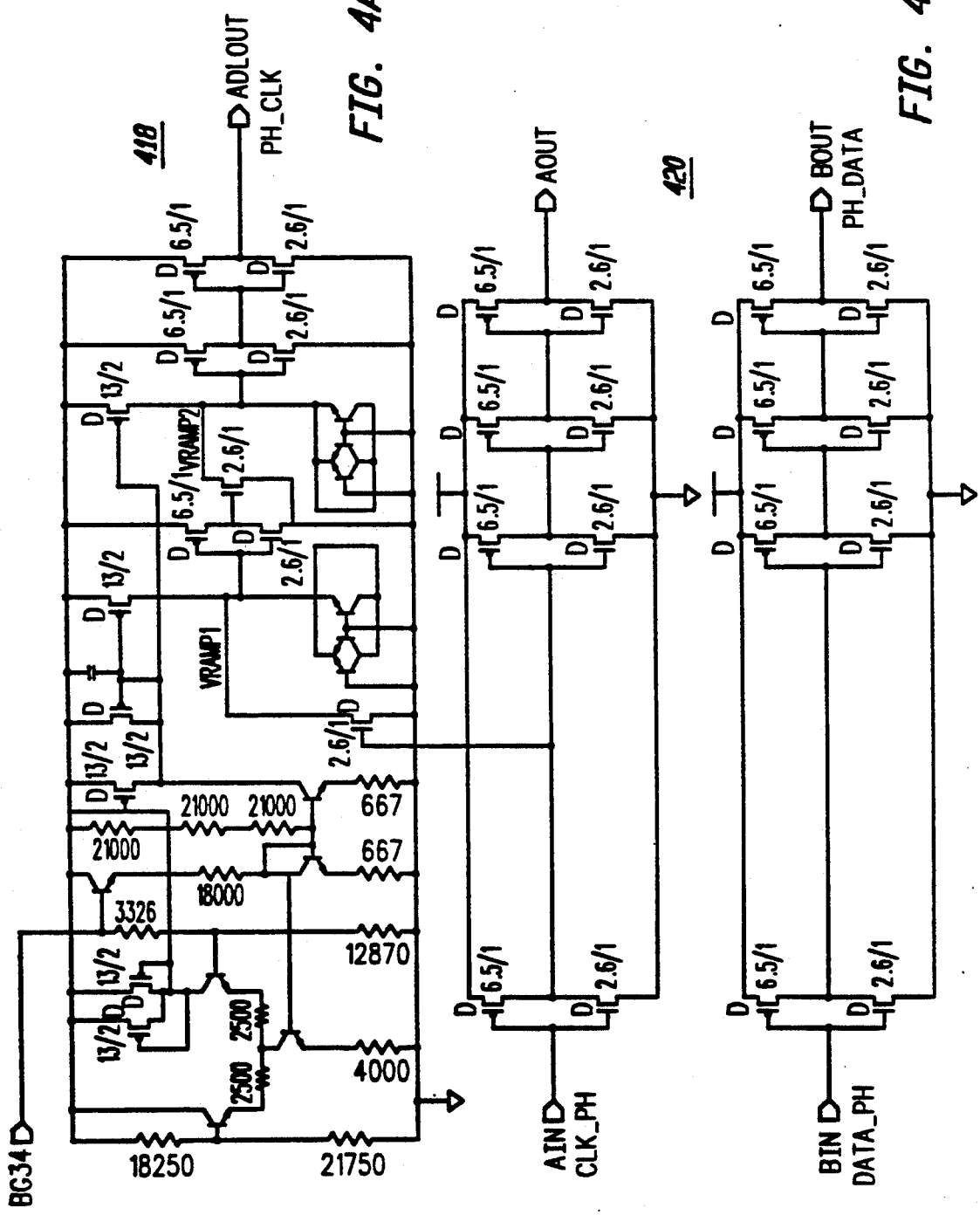

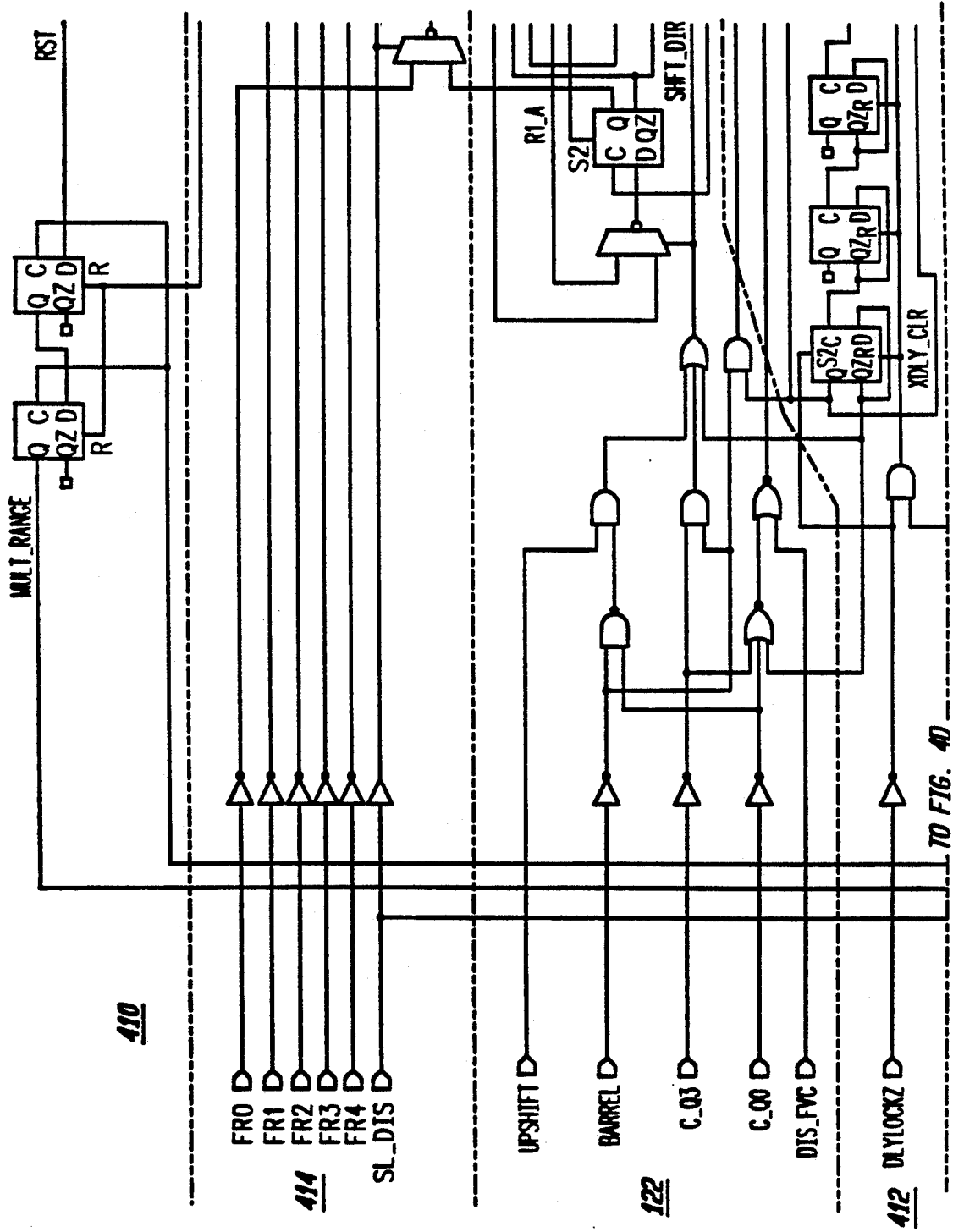

FIG. 4D

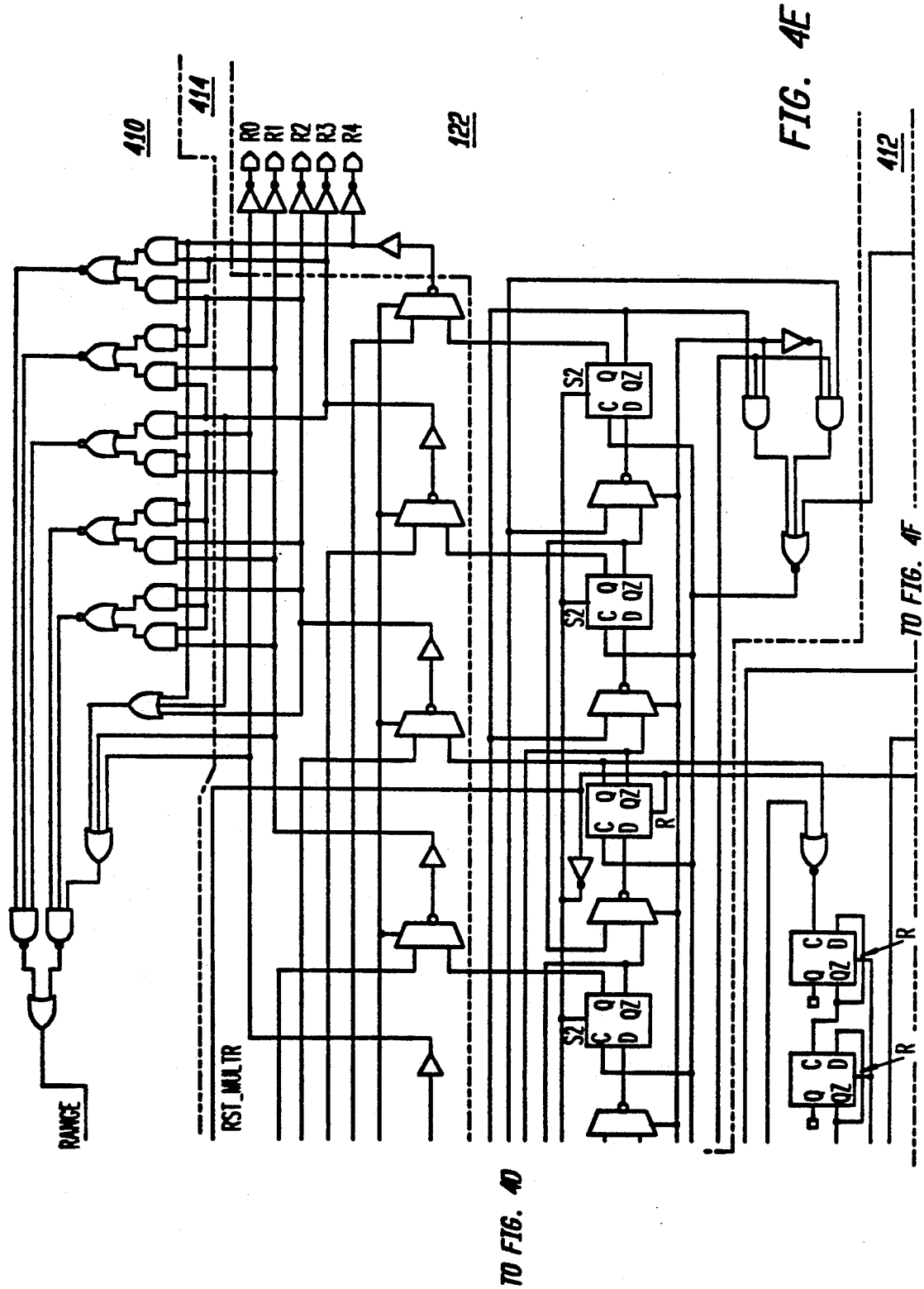

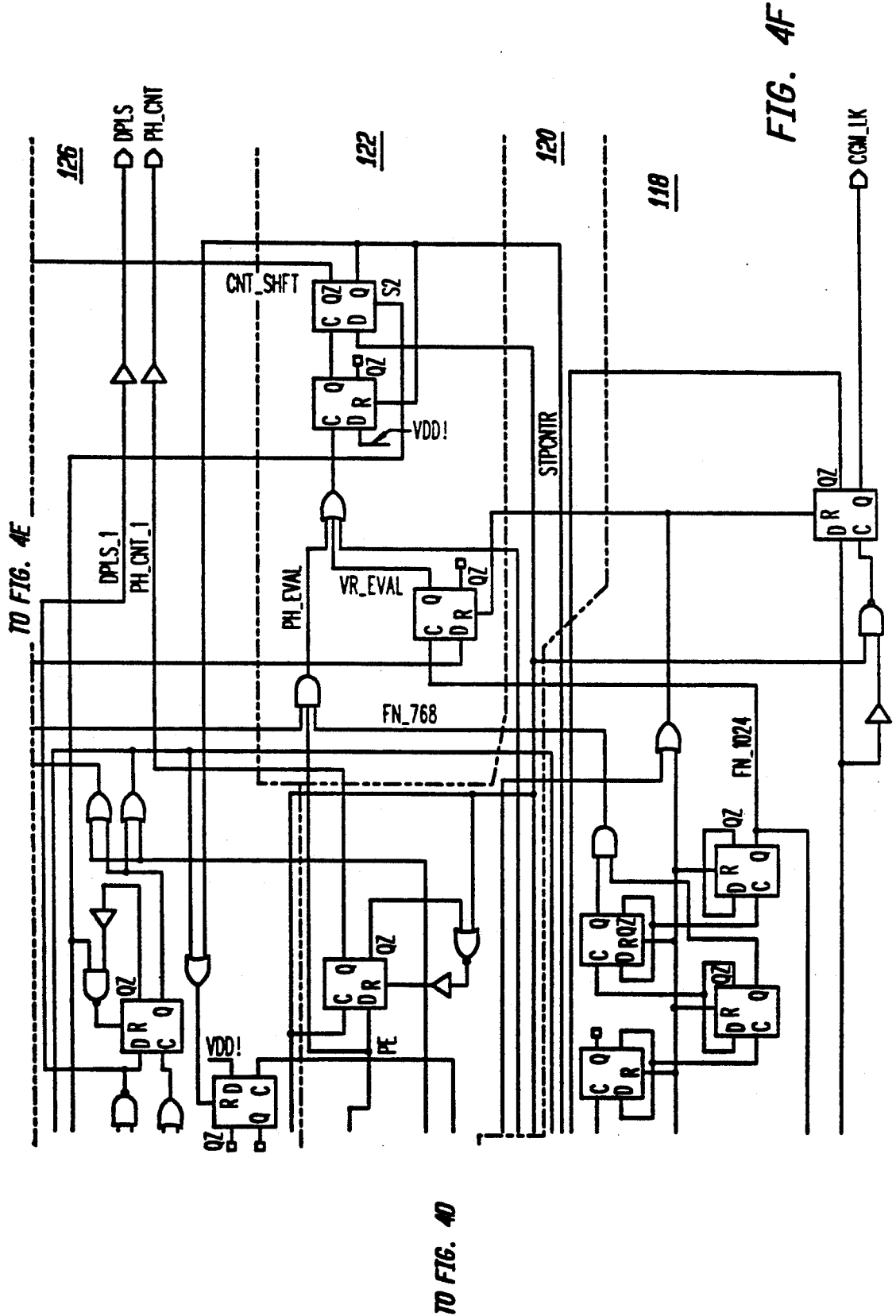

VCO BLOCK DIAGRAM

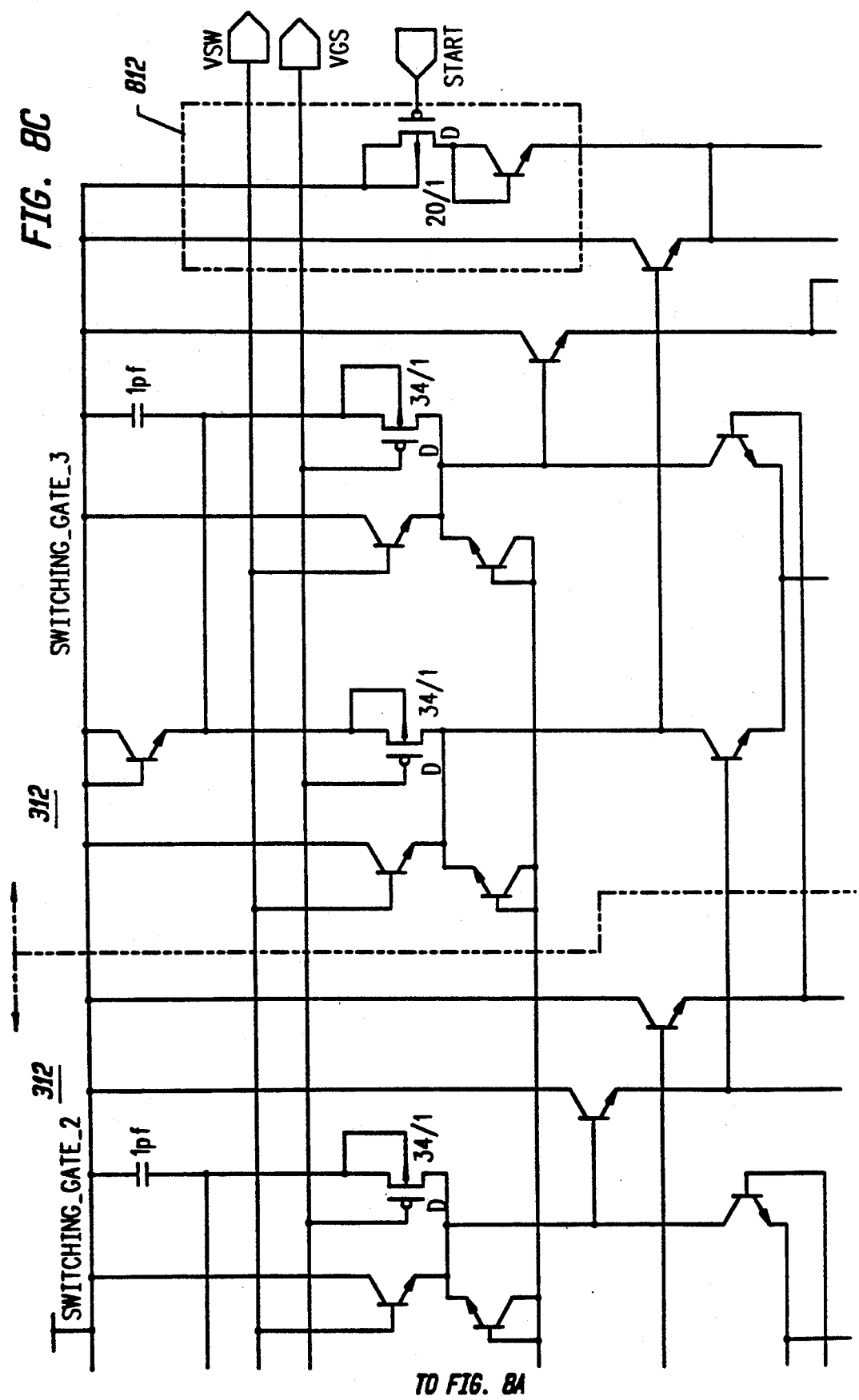

LOW-GAIN, RANGE PROGRAMMABLE, TEMPERATURE COMPENSATED VOLTAGE CONTROLLED RING OSCILLATOR

RELATED APPLICATION

The present application is related to commonly-assigned U.S. Patent application Ser. No. 07/915,085 filed by Worden et al of even date herewith, for AN AUTORANGING PHASE-LOCK-LOOP CIRCUIT. The referenced related application is hereby incorporated by reference to provide additional background information regarding the present invention.

BACKGROUND OF THE INVENTION

1. Field of the Invention

The present invention relates to a voltage controlled oscillator in a phase-lock-loop and, in particular, to a range programmable voltage controlled oscillator in an autoranging phase-lock-loop.

2. Description of the Related Art

A voltage controlled oscillator (VCO) is a device which can generate an arbitrary number of oscillator signals over a frequency range by varying an input voltage signal. In practice, the frequency range of the VCO is limited by the required stability of the oscillator signal. A stable oscillator signal is an oscillator signal the frequency of which remains constant within the error tolerances of the circuit which is to receive the oscillator signal.

A number of factors can effect the frequency of an oscillator signal. First, the frequency of an oscillator signal can be affected by fluctuations of the input voltage signal. The effect of fluctuations of the input voltage signal presents a design trade-off between stability and frequency coverage.

For example, a high-gain VCO may operate over a frequency range of 300 MHz (megahertz) by varying the input voltage signal from one to four volts. When a voltage fluctuation of one tenth of a volt occurs, the oscillator signal may temporarily shift its frequency by as much as 10 MHz.

Whether such a shift poses design problems depends on the error tolerances of the circuit which is to receive the oscillator signal. For circuits which cannot tolerate a sudden frequency shift of 10 MHz, the shift can produce unacceptable timing errors.

A low-gain VCO, on the other hand, operates over a much smaller frequency range, thereby minimizing the effects of any fluctuations of the input voltage signal. For example, a low-gain VCO may operate over a frequency range of 75 MHz over the same input voltage range. With a low-gain VCO, each one tenth of a volt voltage fluctuation produces a much smaller frequency shift of approximately 2.5 MHz.

Thus, by reducing the frequency range, a more stable oscillator signal is generated. The problem, however, is that such a narrow frequency range severely limits the application of the low-gain VCO.

Traditionally, the VCO is utilized to track a reference signal. The VCO tracks the reference by utilizing a phase-lock-loop which provides the input voltage signal to the VCO by comparing the oscillator signal that is currently being generated with the reference signal. As long as there is a difference between the current oscillator signal and the reference signal, the phase-lock-loop continues to change the input voltage, thereby changing the current oscillator signal. When the current oscillator signal and the reference signal are matched, the phase-lock-loop stops changing the input voltage, thereby maintaining an oscillator signal which is locked to the referenced signal.

Variations in the surrounding temperature can cause the frequency of the oscillator signal to shift. Although a closed phase-lock-loop will adjust itself for temperature, supply voltage, and process variations by adjusting itself to a new bias point, a low-gain VCO which, as in the above example, is limited to a 75 MHz frequency range, will not be able to continually track the reference signal if the oscillator signal drifts outside of the 75 MHz range. This is particularly likely to happen if the original reference signal is near the end of the frequency range.

In addition, having such a narrow frequency range requires that the reference signal be matched to the VCO. Thus, rather than having one high-gain VCO which can cover a variety of reference signals, a different low-gain VCO must be used for each reference signal which is outside of the frequency range of the low-gain VCO.

Thus, there is a need for a VCO which has multiple low-gain frequency ranges and which can generate oscillator signals with a constant frequency over variations in the surrounding temperature.

SUMMARY OF THE INVENTION

In accordance with the present invention, a range programmable voltage controlled oscillator in an autoranging phase-lock-loop is disclosed. The range programmable voltage controlled oscillator, which has a plurality of low-gain frequency ranges, generates a current oscillator signal in response to one of a plurality of range select signals and a loop filter voltage. The range select signals select which of the low-gain frequency ranges the range programmable voltage controlled oscillator will operate in. The loop filter voltage varies the frequency of the oscillator signal within each low-gain frequency range. A timer generates a first enable signal a preselected settling time after receiving a reset signal and removes the first enable signal a preselected turn-off time after generating the first enable signal if the timer has not received a subsequent reset signal since the most recent first enable signal was generated. A phase error detector compares the current oscillator signal to a reference signal when the first enable signal is received and generates a shift signal and the reset signal if a phase error is present. The phase error detector stops comparing the current oscillator signal and the reference signal when the first enable signal is removed. A shift register receives the shift signal and then generates a new range select signal. The VCO receives the new range select signal and shifts into a new low-gain frequency range. A phase comparator compares the current oscillator signal to the reference signal and generates a difference signal in response. A loop filter generates the loop filter voltage in response to the difference signal.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 4A, 4B, 4C, 4D, 4E and 4F are schematic diagrams illustrating a portion of an embodiment of the FIG. 1 autoranging phase-lock-loop circuit.

FIGS. 8A, 8B, 8C, and 8D are schematic diagrams illustrating a portion of an embodiment of three FIG. 7 oscillator circuits.

DETAILED DESCRIPTION

Figure 1:
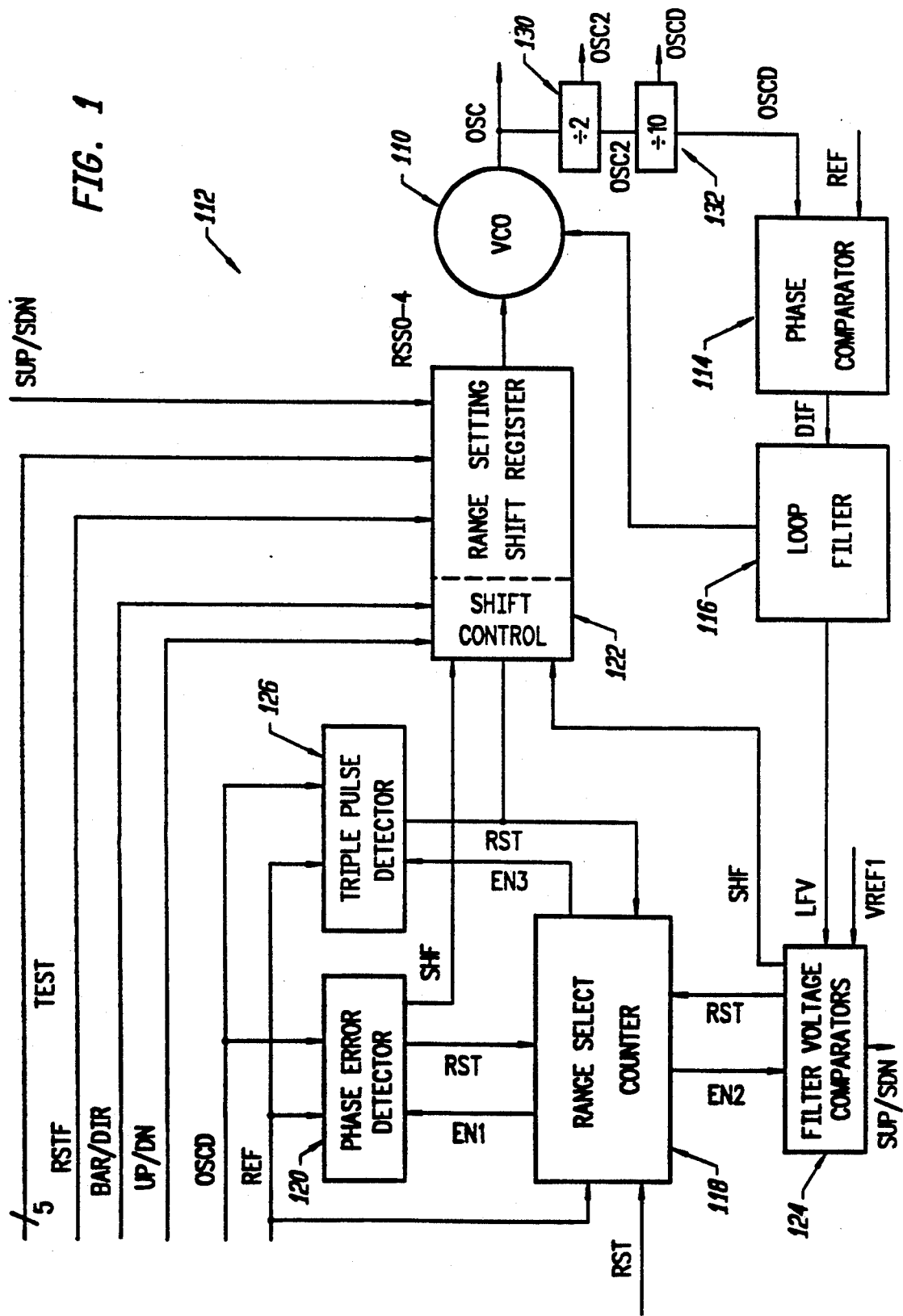
FIG. 1 is a block diagram illustrating an autoranging phase-lock-loop circuit in accordance with the present invention.

FIG. 1 shows an autoranging phase-lock-loop circuit 112 that provides a means for locking a divided oscillator output signal OSCD of a voltage controlled oscillator (VCO) 110 to a reference signal REF by increasing or decreasing the frequency of divided oscillator output signal OSCD until the frequency of divided oscillator output signal OSCD matches the frequency of reference signal REF.

Phase-lock-loop circuit 112 includes a range programmable voltage controlled oscillator 110 that generates an oscillator output signal OSC, which has a predicted frequency of 250 MHz, in one of five oscillator ranges in response to one of five corresponding range select signals RSS0-RSS4. In addition, VCO 110 varies the frequency of oscillator output signal OSC in response to a loop filter voltage LFV.

A first divider circuit 130 receives oscillator output signal OSC and generates a divide-by-two oscillator output signal OSC2 which has a predicted frequency of 125 MHz. A second divider circuit 132 receives divide-by-two oscillator output signal OSC2, and generates divided oscillator output signal OSCD which has a predicted frequency of 12.5 MHz.

As further shown in FIG. 1, a range select counter 118 generates a first enable signal EN1 a preselected settling time after receiving a delayed reset signal RST and then, if range select counter 118 has not been reset, removes first enable signal EN1 and generates a second enable signal EN2 a preselected turn-off time after generating first enable signal EN1.

A phase error detector 120 compares divided oscillator output signal OSCD currently being generated by VCO 110 to a 12.5 MHz reference signal REF in response to first enable signal EN1. If a phase error is detected, then phase error detector 120 generates a shift signal, and then, after a delay time, generates delayed reset signal RST. Phase error detector 120 suspends comparison of divided oscillator output signal OSCD and reference signal REF when first enable signal EN1 is removed.

A shift register 122 selects a next operating range in response to shift signal SHF by generating a next range select signal from five range select signals RSS0-4.

A phase comparator 114 compares current divided oscillator output signal OSCD to reference signal REF and generates a difference signal DIF in response thereto.

A loop filter 116 responds to difference signal DIF by generating a corresponding loop filter voltage signal LFV for control of VCO 110.

When autoranging phase-lock-loop circuit 112 is energized, VCO 110 receives a first range select signal RSS2 and a loop filter voltage LFV and in response generates a corresponding oscillator output signal OSC.

As stated above, phase comparator 114, receives divided oscillator output signal OSCD and the 12.5 MHz reference signal REF, compares the rising edges of divided oscillator signal OSCD and reference signal REF, and then outputs difference signal DIF which represents the difference between the frequency of divided oscillator signal OSCD and the frequency of reference signal REF.

Loop filter 116 responds to difference signal DIF by either increasing or decreasing loop filter voltage LFV within the range of loop filter voltages capable of being generated by loop filter 116. In the preferred embodiment, loop filter voltage LFV ranges from 1 volt to 4 volts.

VCO 110 responds to the increased or decreased loop filter voltage LFV by increasing or decreasing, respectively, the frequency of oscillator output signal OSC until the frequency of divided oscillator output signal OSCD matches the 12.5 MHz frequency of reference signal REF.

VCO 110 is said to be "locked" to reference signal REF when both the phase and frequency of divided oscillator output signal OSCD and the phase and frequency of reference signal REF are matched within the error tolerance of autoranging phase-lock-loop circuit 112. On the other hand, VCO 110 is said to be "out of lock" when loop filter voltage LFV has been increased or decreased to the limits of loop filter 116, thereby increasing or decreasing the frequency of oscillator output signal OSC to its full extent, and the phase and frequency of divided oscillator output signal OSCD and the phase and frequency of reference signal REF remain unmatched.

In accordance with the preferred embodiment, if VCO 110 remains out of lock after a preselected settling time (see below), autoranging phase-lock-loop circuit 112 commands VCO 110 to step to a new operating range by generating a next range select signal RSS0-3. As discussed in greater detail below, the next operating range may have a center frequency which is greater than or lesser than the center frequency of the present range.

By stepping from one operating range to another operating range with a constant loop filter voltage LFV, the frequency of oscillator output signal OSC changes by a 18.75 MHz step. This results in a frequency range of operation over the loop filter voltage range that is shifted up or down by 18.75 MHz from the original operating range.

When oscillator output signal OSC has been generated in the next operating range, autoranging phase-lock-loop circuit 112 attempts to lock oscillator output signal OSC onto reference signal REF by again varying loop filter voltage LFV in response to difference signal DIF. If VCO 110 remains out of lock after the settling time has expired for a second time, then autoranging phase-lock-loop circuit 112 again commands VCO 110 to step to the next operating range by generating the next range select signal RSS0-4. This process is repeated as described above until VCO 110 locks onto reference signal REF. As stated above, in the preferred embodiment, VCO 110 may operate in one of five operating ranges in response to one of five range select signals RSS0-RSS4.

Figure 2:
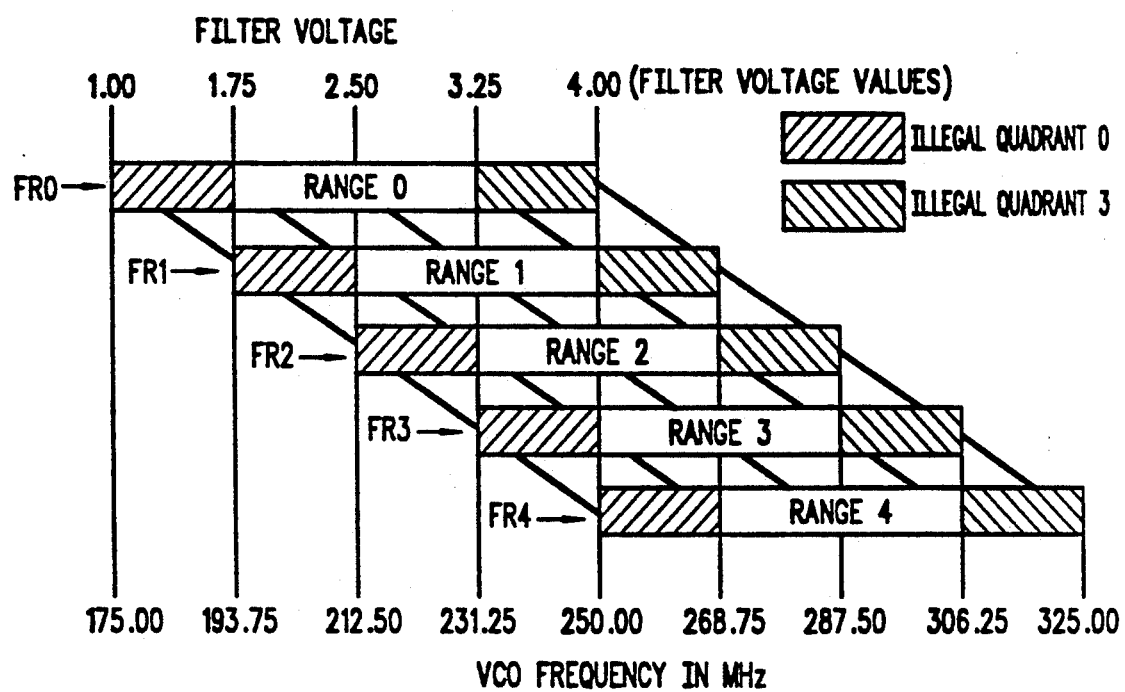
FIG. 2 is a graphical representation of five oscillator operating ranges as a function of loop filter voltage.

FIG. 2 shows the five operating ranges FR0-FR4 as a function of loop filter voltage LFV. As shown in FIG. 2, frequency range FR0 ranges from 175.00 to 250.00 MHz, frequency range FR1 ranges from 193.75 to 268.75 MHz, frequency range FR2 ranges from 212.50 to 287.50 MHz, frequency range FR3 ranges from 231.25 to 306.25 MHz, and frequency range FR4 ranges from 250.00 to 325.00 MHz.

Each of the five frequency ranges FR0-FR4 represents the range of frequencies wherein VCO 110 can lock on to a compatible reference signal. For example, if a 250 MHz reference signal REF is within second frequency range FR2, (212.50 MHz to 287.5 MHz), then VCO 110 will be able to lock onto reference signal REF by varying loop filter voltage LFV as described above.

If, however, reference signal REF is below second frequency range FR2; e.g., at 200 MHz, then VCO 110 will not be able to lock onto reference signal REF because loop filter voltage LFV will not have sufficient range; i.e., VCO 110 will bottom out at 212.5 MHz, and VCO 110 will remain out of lock after the settling time has expired. The autoranging phase-lock-loop circuit 112 will then step VCO 110 to a different operating range according to the particular search routine employed (as discussed in greater detail below).

Since the frequency of the next operating range is now 18.75 MHz lower than the original operating range (193.75 MHz to 268.75 MHz), VCO 110 will now be able to match the phase and frequency of reference signal REF by varying loop filter voltage LFV as noted above.

Figure 3:
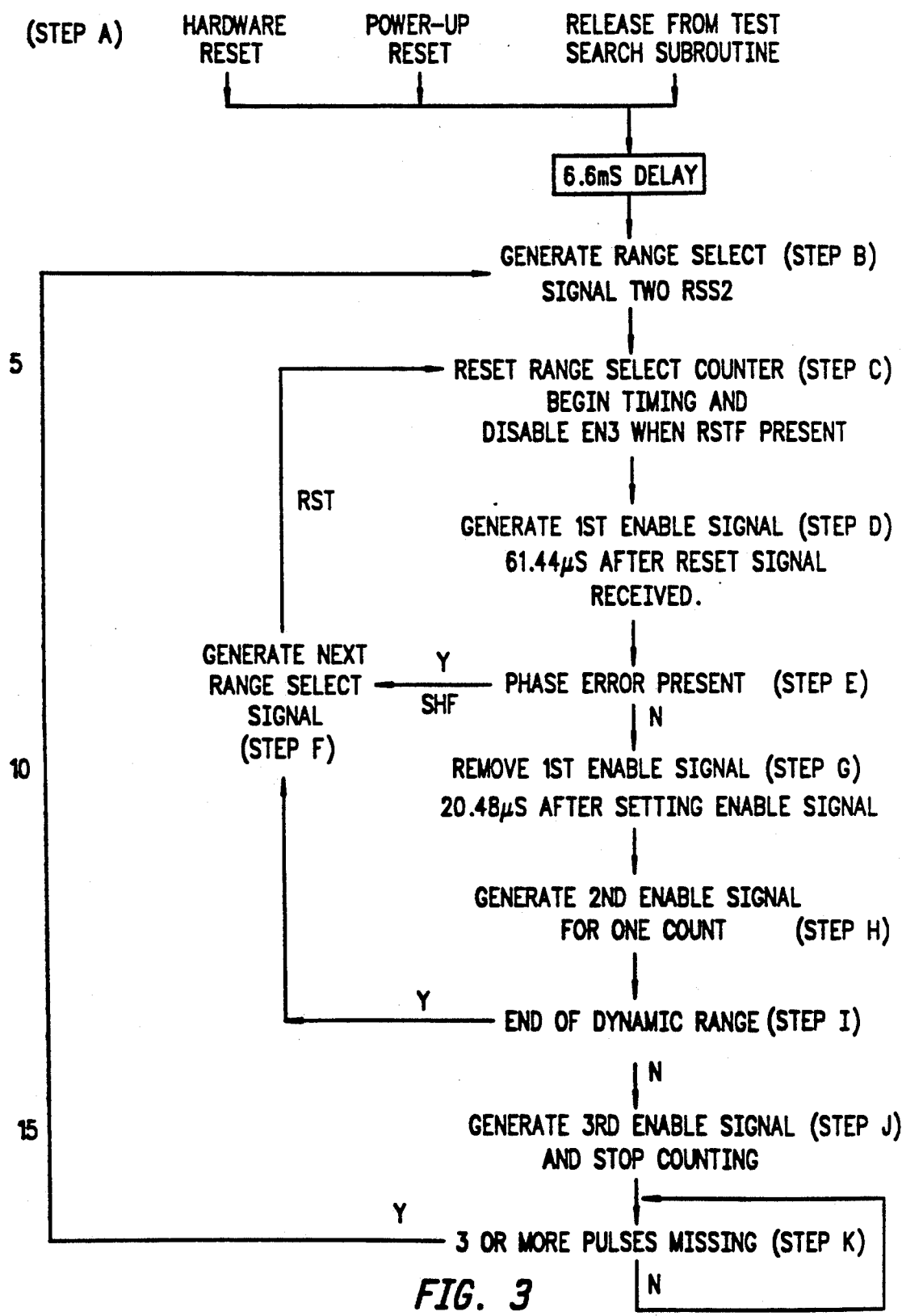
FIG. 3 is a flow chart illustrating the operation of the FIG. 1 autoranging phase-lock-loop circuit.

Referring again to FIG. 1, and as shown in STEP A of FIG. 3, autoranging phase-locked-loop circuit 112 generates a first command to operate in an operating range by generating a forced reset signal RSTF. Forced reset signal RSTF is generated approximately 6.6 mS (milliseconds) after autoranging phase-locked-loop circuit 112 has been powered up, reset by the hardware, or released from a test search routine (see below). The 6.6 mS delay is provided by a 6.6 mS timer circuit 412 (see FIGS. 4C and 4E).

As shown in FIG. 1 and STEP B of FIG. 3, shift register 122 receives forced reset signal RSTF and in response generates second range select signal RSS2.

As shown in FIG. 1 and STEP C of FIG. 3, a ten-bit ripple range select counter 118 receives forced reset signal RSTF and, in response, removes a third enable signal EN3 (see below) and begins timing the settling time. Forced reset signal RSTF resets range select counter 118 a delay time after shift register 122 receives forced reset signal RSTF. The delay time allows VCO 110 to begin generating an oscillator output signal OSC at substantially the same time that counter 118 begins timing.

The settling time, which in the preferred embodiment is approximately 61.44 uS (microseconds) or 768 counts, is provided to allow VCO 110 sufficient time to lock onto reference signal REF by varying loop filter voltage LFV as described above. After the settling time has expired, as shown in STEP D of FIG. 3, range select counter 118 generates first enable signal EN1.

As shown in FIG. 1 and STEP E of FIG. 3, phase error detector 120, receives first enable signal EN1, a divided oscillator output signal OSCD and reference signal REF and, in response, begins comparing the rising edges of divided oscillator output signal OSCD and reference signal REF to determine if a phase error is present. If divided oscillator output signal OSCD is out of phase from reference signal REF by more than $+/-4$ nanoseconds, a phase error exists. As shown in STEP F of FIG. 3, when a phase error exists, phase error detector 120 generates a shift signal SHF, which generates the next range select signal RSS0-4 by shifting shift register 122 in accordance with a selection routine (discussed below), and then, after the delay time, generates a delayed reset signal RST, which resets counter 118 to begin counting again.

After second range select signal RSS2 has been generated following forced reset signal RSTF, shift register 122 selects the next operating range using one of two primary selection routines; a direct search routine or a barrel routine. Referring again to FIG. 1, the barrel routine, which includes a barrel up and a barrel down subroutine, is selected by asserting a BAR/DIR signal high. The direct search routine is selected by asserting the BAR/DIR signal low. The barrel up subroutine is selected by asserting a barrel up/barrel down signal UP/DN high; the barrel down subroutine is selected by asserting the barrel up/barrel down signal UP/DN low.

When the barrel up subroutine has been selected, shift register 122 sequentially selects the oscillator output signal which has the next higher frequency. In the barrel up approach, each subsequent range select signal commands VCO 110 to increase the frequency of the current oscillator output signal by 18.75 MHz until the next 18.75 MHz increase would exceed 325.00 MHz. When the next increase would exceed 325.00 MHz, the next range select signal commands VCO 110 to reduce the frequency of the current oscillator output signal by 75 MHz (18.75 MHz times 4) whereupon subsequent range select signals command VCO 110 to again incrementally increase the frequency of the current oscillator output signal.

Conceptually, the barrel up approach may be thought of as sequentially stepping from frequency range FR2 to frequency range FR3 to frequency range FR4 to frequency range FR0 to frequency range FR1 to frequency range FR2.

Similarly, when the barrel down subroutine has been selected, shift register 122 continually selects the oscillator output signal which has the next lower frequency. In the barrel down approach, each subsequent range select signal commands VCO 110 to decrease the frequency of the current oscillator output signal by 18.75 MHz until the next 18.75 MHz decrease would fall below 175.00 MHz. When the next decrease would fall below 175.00 MHz, the next range select signal commands VCO 110 to increase the frequency of the current oscillator output signal by 75 MHz (18.75 MHz times 4) whereupon subsequent range select signals command VCO 110 to again incrementally decrease the frequency of the current oscillator output signal.

Conceptually, the barrel down approach may be thought of as sequentially stepping from frequency range FR2 to frequency range FR1 to frequency range FR0 to frequency range FR4 to frequency range FR3 to frequency range FR2.

If the direct selection routine has been selected, then shift register 122 receives the search up/search down signal SUP/SDN from filter voltage comparator 124. If filter voltage comparator 124 indicates that loop filter voltage LFV is in excess of 3.25 volts by asserting shift signal SHF, then shift register 122 selects the oscillator output signal which has the next lower frequency. If filter voltage comparator 124 indicates that loop filter voltage LFV is below 1.75 volts, then shift register 122 selects the oscillator output signal which has the next higher frequency.

As shown in FIG. 1, in addition to the above-described selection routines, autoranging phase-lock-loop circuit 112 also responds to a five-bit test signal TEST generated by a test circuit 414 (see FIGS. 4C and 4E) which commands shift register 122 to generate a particular range select signal thereby causing VCO 110 to step to a particular operating range.

As shown in STEP G of FIG. 3, if after a verification time has expired range select counter 118 has not been reset, range select counter 118 removes first enable signal EN1. The verification time, which in the preferred embodiment is approximately 20.48 uS or 256 counts, is provided to allow phase error detector 120 time to determine whether oscillator output signal OCS has locked onto reference signal REF to within +/− 195 ppm (parts per million). A +/− 4 nanosecond phase difference during a 20.48 uS verification time period equates to a lock quality of +/− 195 ppm.

Referring to FIGS. 4A and 4B, a first delay circuit 418 and a second delay circuit 420 are used to achieve the +/− 4 nS phase error detection necessary in autoranging phase-lock-loop circuit 112. The first delay circuit 418 and the second delay circuit 420 receive a delay current which is substantially independent of variations in temperature and supply voltage. The delay current is substantially independent of variations in temperature and supply voltage because the delay current is referenced to a bandgap voltage (see below).

Figure 4D:
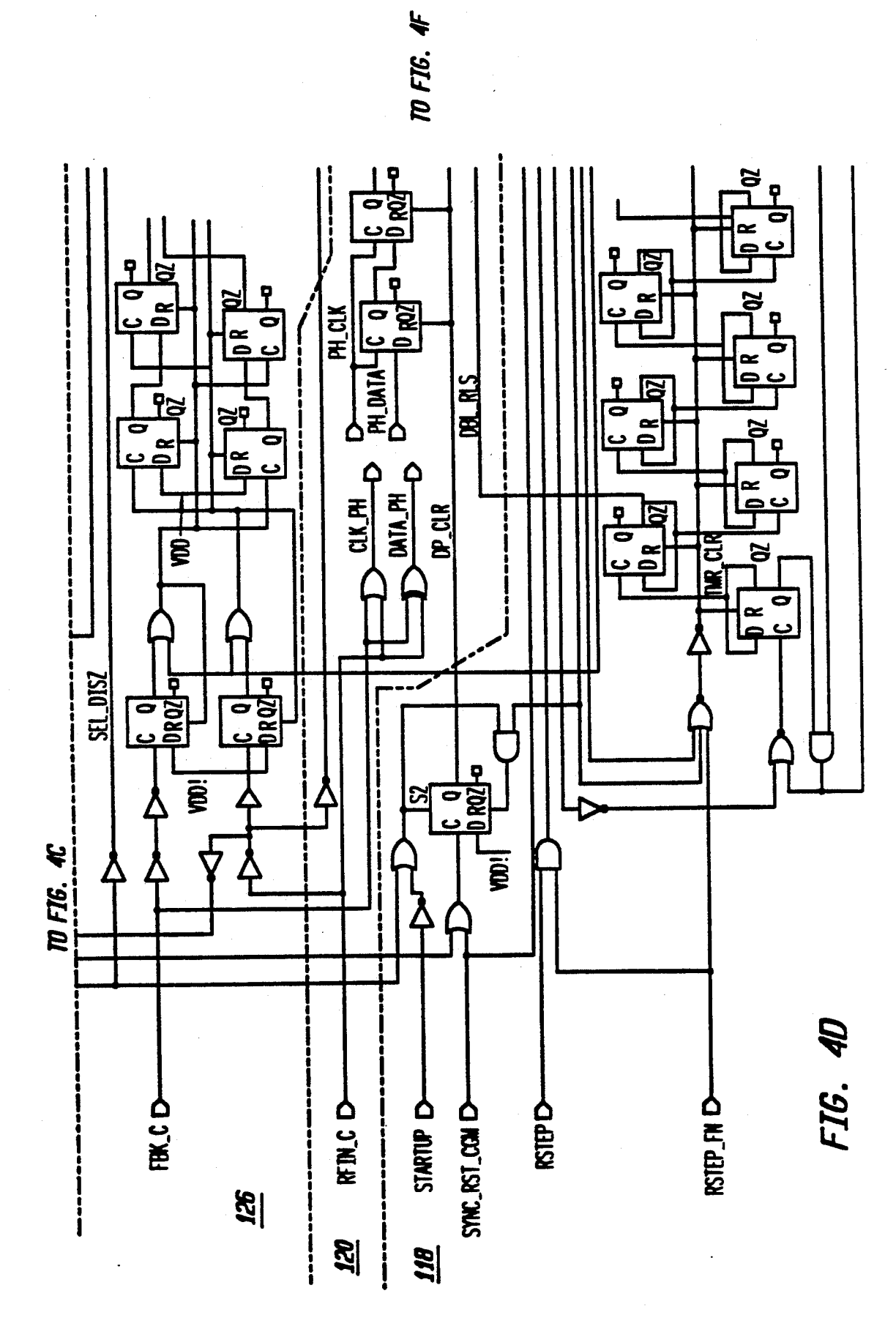

The delay current is driven into a fixed base-emitter capacitor to obtain a controlled first delay circuit 418 and second delay circuit 420. First delay circuit 418 and second delay circuit 420 are used to match both rising and falling edge transitions. Referring to FIG. 4D, a parallel path matching the CMOS gate delays is provided such that the delay delta between AIN and AOUT and AIN to ADLYOUT is the 4 nS delay. First delay circuit 418 and second delay circuit 420 are then connected to the autoranging phase-lock-loop circuit 112 (range select) by connecting CLK PH to AIN, DATA PH to BIN, PH CLK to AOUTDLY, and PH DATA to BOUT. This provides the controlled delay to phase error detector 120 in the autoranging phase-lock-loop circuit 112.

As shown in STEP H of FIG. 3, if first enable signal EN1 is removed prior to range select counter 118 being reset, range select counter 118 generates a second enable signal EN2 for one count.

Referring to FIG. 1, when range select counter 118 generates second enable signal EN2 for one count, filter voltage comparator 124 receives second enable signal EN2, loop filter voltage LFV, and a first reference voltage VREF1 and, in response, instantaneously compares the DC level of loop filter voltage LFV to first reference voltage VREF1. As shown in STEP I of FIG. 3, filter voltage comparator 124 compares loop filter voltage LFV to first reference voltage VREF1 to determine if VCO 110 is locked onto reference signal REF near the end of the dynamic range of loop filter voltage LFV.

Referring again to FIG. 2, it can be seen that if loop filter voltage LFV is between 3.25 volts and 4 volts, an increase of loop filter voltage LFV by more than 0.75 volts due to temperature or power supply VCC fluctuations will cause VCO 110 to break lock. Similarly, if loop filter voltage LFV is between 1 volt and 1.75 volts, any decrease in loop filter voltage LFV which causes the voltage to be reduced by more than 0.75 volts will cause VCO 110 to break lock.

As shown in STEP I of FIG. 3, when loop filter voltage LFV is between 1 volt and 1.75 volts or 3.25 volts and 4 volts, filter voltage comparator 124 will generate shift signal SHF and then, after the delay time, generate delayed reset signal RST. As described above, when delayed reset signal RST is generated, range select counter 118 is reset and begins timing the settling time. When shift signal SHF is generated, shift register 122 generates another range select signal in accordance with the selected search routine.

Filter voltage comparator 124 allows VCO 110 to lock onto reference signal REF in the middle of one of the frequency ranges so that minor excursions by loop filter voltage LFV will not cause oscillator output signal OSC to break lock.

As shown in STEP J of FIG. 3, when loop filter voltage LFV is between 1.75 and 3.25 volts, range select counter 118 generates a third enable signal EN3 and stops counting. At this point, VCO 110 has successfully locked onto reference signal REF in a frequency range that provides a sufficient dynamic range.

Referring again to FIG. 1, a triple pulse detector 126 is utilized to protect against a catastrophic failure of the loop. Triple pulse detector 126 receives third enable signal EN3 and, in response, begins detecting the presence of current oscillator output signal OSC and reference signal REF. As shown in STEP K of FIG. 3, if three or more rising edges of divided oscillator output signal OSCD occur without the occurrence of a rising edge of reference signal REF, then triple pulse detector 126 generates forced reset signal RSTF. Shift register 122 receives forced reset signal RSTF and in response generates second range select signal RSS2 again. Additionally, range select counter 118 receives delayed reset signal RST the delay time later, resets counter 118, disables third enable signal EN3, and begins timing again.

Similarly, if three or more rising edges of reference signal REF occur without the occurrence of a rising edge of the oscillator output signal, triple pulse detector 126 will also generate delayed reset signal RST.

Additionally, triple pulse detector 126 and phase error detector 120 provide outputs from a test circuit. Once VCO 110 has locked onto reference signal REF, phase error detector 120 will continue to output shift signal SHF. Similarly, after lock, triple pulse detector 126 will generate shift signal SHF as described above. This capability allows bench test equipment or automatic test equipment to capture shift signal SHF from either device and monitor quality-of-lock and loss-of-lock problems. Both of these problems are usually sporatic events that automatic testers cannot locate by monitoring the current oscillator signal and the reference signal independently.

The phase error detector 120 will also provide a simple GO/ NO GO digital test for lock, replacing the more cumbersome repetitive AC parametric testing presently in use. This represents both a faster, cheaper, and more reliable testing method.

Filter voltage comparator 124 also provides a test output. Once VCO 110 has locked onto reference signal REF, filter voltage comparator 124 will continue to output shift signal SHF. By capturing shift signal SHF, automatic test equipment may track VCO gain versus frequency range performance. This allows better tracking of the device versus process and offers a new tool for yield analysis and enhancement. Being able to evaluate the critical relationship of VCO gain versus frequency range on an automated basis allows for more accurate data for future modeling.

In the preferred embodiment of the present invention, a portion of shift register 122, 6.6 millisecond timer circuit 412, test circuit 414, and a multiple active range detector 410 are configured as illustrated in FIG. 4C. Multiple active range detector 410 monitors range select signals RSS0-RSS4 and generates forced reset signal RSTF if more than one range select signal is active at a time. The 6.6 mS timer circuit 412 prevents forced reset signal RSTF from being issued until a 6.6 mS delay has expired after VCO 110 is powered up, reset in hardware, or released from a test search.

A portion of counter 118, phase error detector 120, and triple pulse detector 126 are configured as illustrated in FIG. 4D. The first delay circuit 418 and the second delay circuit 420 are configured as shown in FIGS. 4A and 4B. A portion of shift register 122, 6.6 millisecond timer circuit 412, test Circuit 414, and a multiple active range detector 410 are configured as illustrated in FIG. 4E. A portion of counter 118, phase error detector 120, and shift register 122 are configured as illustrated in FIG. 4F.

Figure 5:
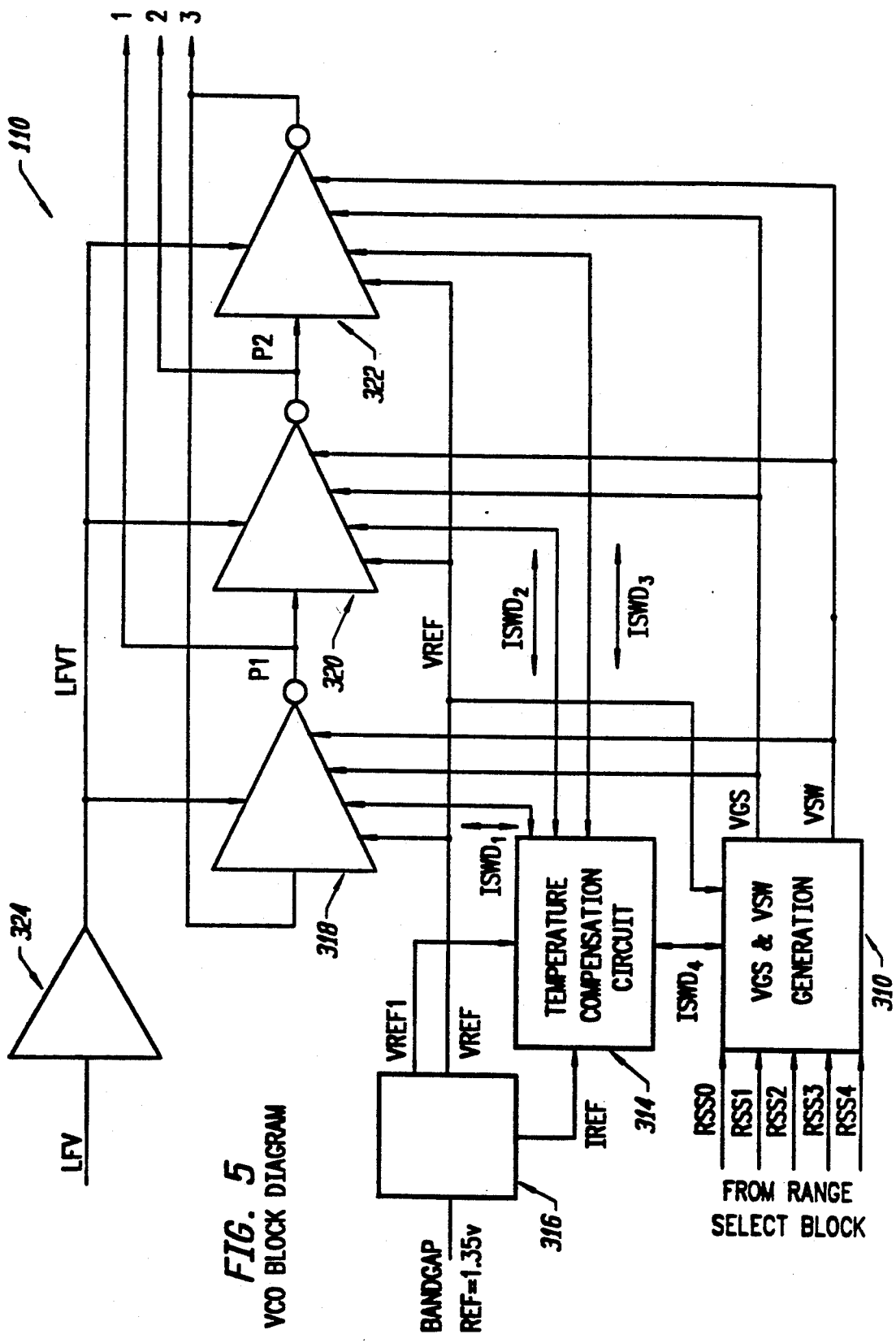
FIG. 5 is a block diagram illustrating a range programmable voltage controlled oscillator utilizable in the FIG. 1 circuit.

Referring to FIG. 5, VCO 110 of the present invention is shown. As shown in FIG. 5, a VGS and VSW generation circuit 310, which is electrically coupled to three equivalent oscillator stages 318, 320, 322, generates a corresponding gate-to-source voltage VGS and a switch voltage VSW in response to the range select signals RSS0-RSS4.

In addition, a unity-gain loop filter operational amplifier 324 receives loop filter voltage LFV, which is referenced to ground, and translates loop filter voltage LFV into a translated loop filter voltage LFVT, which is referenced to power supply VCC. Each of three oscillator stages 318, 320, 322, then receives gate-to-source voltage VGS, switch voltage VSW, and translated loop filter voltage LFVT and, in response, generates a corresponding oscillator signal P1-P3, respectively.

The three oscillator signals P1-P3 are equivalent except for a phase delay associated with each succeeding oscillator stage. As shown in FIG. 5, first oscillator signal P1, which is output from first oscillator stage 318, is input to second oscillator circuit 320. Since each of the three oscillator stages is equivalent, it can been seen that second oscillator signal P2, which is output from second oscillator stage 320, is equivalent to first oscillator signal P1 except for the time required for first oscillator signal P1 to be transformed by second oscillator stage 320 into second oscillator signal P2. Similarly, third oscillator signal P3 is equivalent to second oscillator signal P2 except for the time required for second oscillator signal P2 to be transformed by third oscillator stage 322 into third oscillator signal P3.

Figure 6:
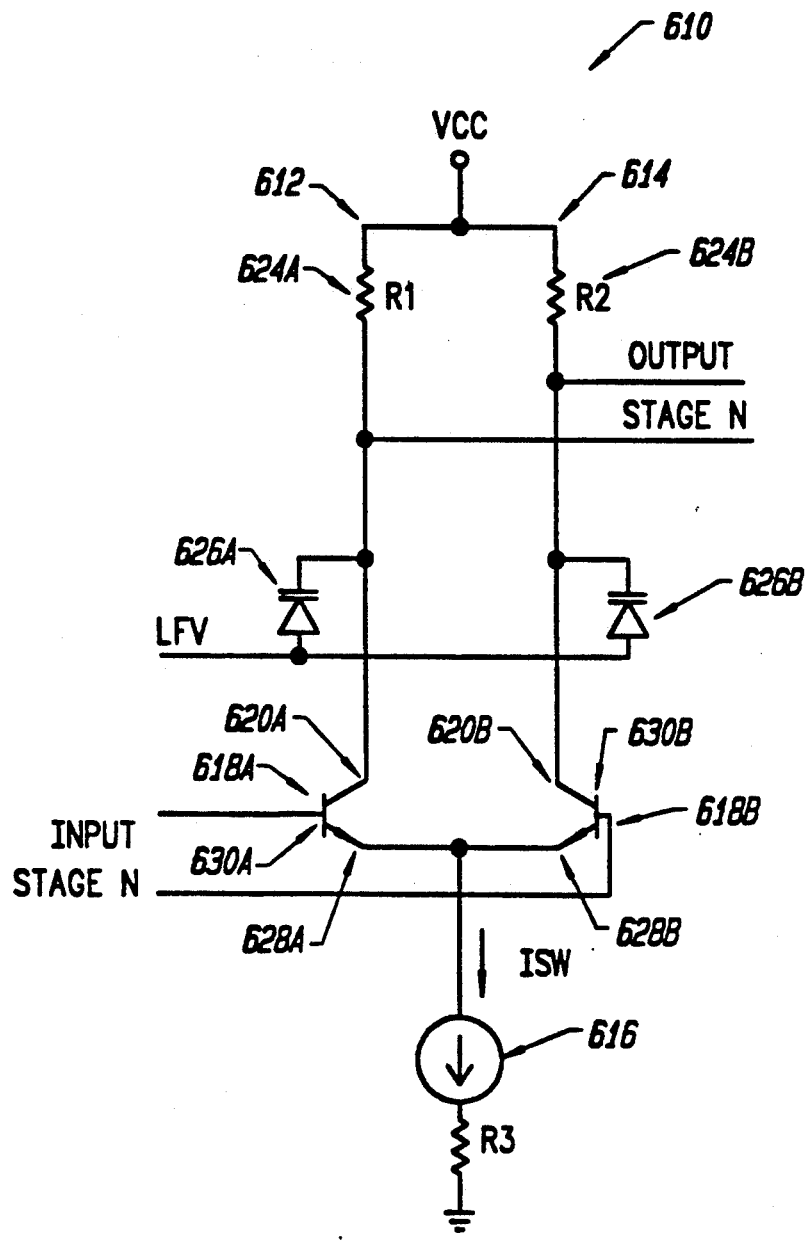
FIG. 6 is a schematic diagram illustrating one oscillator stage of the range programmable voltage controlled oscillator shown in FIG. 5.

FIG. 6 shows, one of three equivalent oscillator stages 318, 320, 322, configured as a differential pair 610. As shown in FIG. 6, differential pair 610 includes two legs 612 and 614 which alternately provide a current path for a fixed current ISW from a power supply VCC to a first current source 616. Each leg 612 and 614 of differential pair 610 includes a switching transistor 618a, 618b, respectively, having collectors 620a and 620b, respectively, connected first to a power supply VCC through resistors 624a and 624b, respectively, and second to translated loop filter voltage LFVT through varactors 626a and 626b, respectively, and having emitters 628a and 628b, respectively, connected to first current source 616.

The output voltage of each leg 612 and 614 of differential pair 610, which provides the oscillator output signal, is taken at collector terminals 620a and 620b of switching transistors 618a and 618b, respectively. The input of each leg 612 and 614, which, as stated above, is electrically coupled to the output of a previous oscillator stage, is at bases 630a and 630b of each of switching transistors 618a and 618b, respectively.

In operation, the base-emitter junction of each switching transistor 618a, 618b, is alternately forward-biased and reverse-biased by oscillator output signal OSC and its compliment which have been provided by the previous oscillator stage so that one switching transistor 618a, 618b, turns on and off while the other switching transistor 618a, 618b, turns off and on, respectively.

As each switching transistor 618a, 618b, switches from an off to an on state and from an on to an off state, the frequency of oscillator output signal OSC will be defined first by the voltage drop across its corresponding resistor, 624a, 624b, which is equivalent to the output voltage measured at collectors 620a and 620b of corresponding switching transistor 618a and 618b, respectively, and second by the slew rate.

The voltage drop across first resistors 624a and 624b is a function of a peak voltage, i.e. the voltage drop across the resistor when the switching transistor is off or is non-conducting, and a low voltage, i.e. the voltage drop across the resistor when the switching transistor is on or conducting.

The slew rate is defined as the voltage swing divided by the time required for the switching transistor to switch from the off to the on state or from the on to the off state while charging and discharging, respectively, varactors 626a and 626b.

Since, as stated above, the frequency of oscillator output signal OSC is a function of the voltage drop across resistors 624a and 624b and the slew rate, it therefore follows that the frequency of oscillator output signal OSC may be changed by changing either of these two parameters.

As stated above, each leg 612 and 614 of differential pair 610 alternately provides a current path for fixed current ISW. Since a constant current will be present whenever a leg 612, 614, is conducting, the frequency of the oscillator output signal may be changed by changing the resistance of resistors 624a and 624b because, in the presence of a constant current, the voltage drop varies with resistance.

To illustrate, if the voltage drop across resistors 624a and 624b is defined by a peak voltage of 5 volts and a low voltage of 4 volts and assuming, for the purposes of this example, that the slew rate is equivalent to 0.5 volts per nanosecond, then it would take 2 nanoseconds for the current oscillator signal to switch from a peak voltage to a low voltage. This is equivalent to 1 nanosecond per cycle or 500 MHz.

If the voltage drop across resistors 624a and 624b is changed so that the peak voltage remains at 5 volts but the low voltage is decreased to 3 volts, then it will take 4 nanoseconds for the current oscillator signal to transition from the peak voltage to the low voltage. This is equivalent to 4 nanoseconds per cycle or 250 MHz.

Thus, by reducing the voltage drop across resistors 624a and 624b, the frequency of oscillator output signal OSC may be increased. Similarly, by increasing the voltage drop across resistors 624a and 624b, the frequency of oscillator output signal OSC may be decreased.

Figure 7:
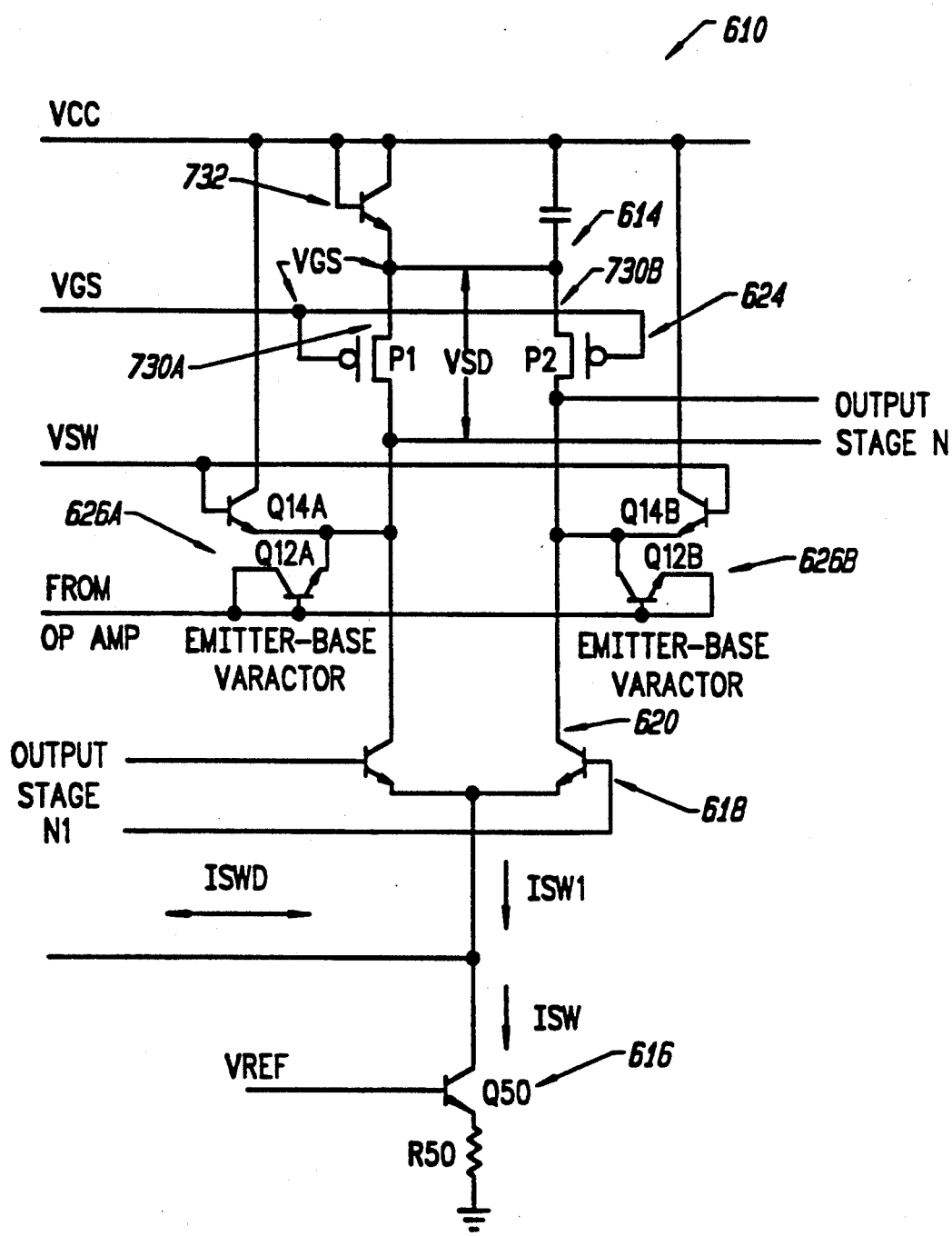
FIG. 7 is a schematic diagram illustrating one oscillator stage of the FIG. 5 range programmable voltage controlled oscillator.

Referring to FIG. 7, which shows the preferred implementation of oscillator stages 318, 320, and 322 of FIG. 5, resistors 624a and 624b are implemented utilizing first p-channel FETs (field effect transistor) P1 and P2, respectively. As is well known, field effect transistors, when properly biased, may operate in a linear or triode range where the field effect transistor behaves as a variable resistor. Thus, by properly biasing first FETs P1 and P2, using five different bias voltages, five different resistor values and, therefore, five different voltage drops and, therefore, five different oscillator frequencies may be generated.

As shown in FIG. 7, first current source 616 is implemented as a first npn current source transistor Q50 having its collector connected to the emitters of switching transistors 618a and 618b, its base connected to a reference voltage VREF, and its emitter connected to ground through a first current source resistor R50.

As stated above, the frequency of oscillator output signal OSC may also be changed by changing the slew rate. Since the slew rate is defined as the amount of time required to discharge and charge varactors 626a and 626b, the slew rate may be defined by:

$$\frac{dv}{dt} = \frac{ISW}{C}.$$

Since, as stated above, fixed current ISW sourced by first current source transistor Q50 is constant, the slew rate may be changed by changing the capacitance on varactors 626a and 626b.

To illustrate, borrowing from the above example where the voltage drop across resistors 624a and 624b was defined by a peak voltage of 5 volts and a low voltage of 4 volts and the slew rate was 0.5 volts per nanosecond, further assume that the slew rate is defined by a current from the first current source of 4 milliampere and a capacitance of 0.8 picofarads. As stated above, it would take 2 nanoseconds to transition from the peak voltage of 5 volts to the low voltage of 4 volts. Now assume that the capacitance is increased from 0.8 picofarads to 1.6 picofarads. The result is that the slew rate is 0.25 volts per nanosecond, translating to a 250 MHz rate.

Thus, by increasing the capacitance, the frequency of oscillator output signal OSC may be decreased. Similarly, by decreasing the capacitance, the frequency of oscillator output signal OSC may be increased.

Referring again to FIG. 6, the capacitance on varactors 626a and 626b is controlled by translated loop filter voltage LFVT. The translated loop filter voltage LFVT reverse-biases varactors 626a and 626b from 0.5 volts to 3.5 volts. Therefore, as stated earlier, the frequency of oscillator output signal OSC may be changed by varying loop filter voltage LFV.

Referring again to FIG. 7, in accordance with an aspect of the present invention, varactors 626a and 626b are comprised of diode transistors Q12a and Q12b having collectors and bases connected to receive translated loop filter voltage LFVT and having emitters connected to collectors 620a and 620b of switching transistor 618a and 618b, respectively.

When a switching transistor 618a, 618b, in a particular leg is not conducting, the voltage on the emitter of diode transistor Q12a, Q12b, in that leg will rise to the peak voltage. Thus, if translated loop filter voltage LFVT is also high, the emitter-base junction of diode transistor Q12a, Q12b, in that leg will only be slightly reverse-biased. Similarly, if translated loop filter voltage LFVT is low in comparison to the voltage at the emitter of diode transistor Q12a, Q12b in that leg, the emitter-base junction will be strongly reverse-biased. The more diode transistors Q12a and Q12b are reversed-biased, the less internal capacitance is present on diode transistors Q12a and Q12b.

For example, when translated loop filter voltage LFVT is high, e.g., 4 volts, and the voltage at the emitter of diode transistor Q12a, Q12b, is also high, e.g., 4.3 volts, diode transistor Q12a, Q12b, is only slightly reversed-biased. On the other hand, when translated loop filter voltage LFVT is low, e.g., 1 volt, diode transistor Q12a, Q12b, is strongly reversed-biased. A full three volt voltage swing of loop filter voltage LFV, and therefore translated loop filter voltage LFVT, corresponds to a frequency variation of +/− 12% from the center value. This is how the low-gain nature of VCO 110 of the present invention is achieved.

As further shown in FIG. 7, to guarantee a full voltage swing (an exact low voltage) regardless of any process variations between first p-channel FETs P1 and P2, npn clamping transistors Q14a and Q14b are utilized on each leg 612 and 614 of differential pair 610. Each clamping transistor Q14a, Q14b, is connected so that its collector is connected to power supply VCC, its base is connected to switch voltage VSW, and its emitter is connected to collectors 620a and 620b of the switching transistors 618a and 618b, respectively. The lowest voltage on the emitters of diode transistors Q12a and Q12b is equivalent to switching voltage VSW minus the voltage associated with the base-emitter junction of clamping transistors Q14a and Q14b, respectively. This is necessarily so because once the voltage drops below this value, clamping transistors Q14a and Q14b become forward-biased and begin to source current.

Clamping transistors Q14a and Q14b guarantee that a full voltage swing will be realized by allowing the gate-to-source voltage of first p-channel FETs P1 and P2 to be set so that first p-channel FETs P1 and P2 will source a current approximately 10% less than the current demanded by fixed current ISW. Thus, as first current source transistor Q50 attempts to sink fixed current ISW from first p-channel FETs P1 and P2, the voltage at collectors 620a and 620b of the switching transistors 618a and 618b, respectively, will drop and clamping transistors Q14a and Q14b, respectively, will become forward-biased, turning on to supply the remaining current to first current source transistor Q50.

For example, assume that the desired source-to-drain voltage is 0.3 volts and further assume that the resistance required to achieve the 0.3 source-to-drain voltage is 1500 ohms. In this situation, in order for clamping transistor Q14a, Q14b, to turn on, the resistance of first p-channel FETs P1 and P2 is set to, for example, 1700 ohms. By setting the actual resistance slightly higher than the resistance needed, the designer can be assured that, even with process variations, a full voltage swing is achieved.

As shown in FIG. 7, sources 730a and 730b of first FETs P1 and P2 are connected to a voltage shifter transistor 732 configured as a diode. The voltage shifter transistor 732 allows the lower voltage swing level, as referenced to power supply VCC, to be equivalent to switching voltage VSW plus the voltage drop associated with the base-emitter junctions of voltage shifter transistor 732 and clamping transistor Q14a, Q14b, so that clamping transistor Q14a, Q14b.

Figure 8A:
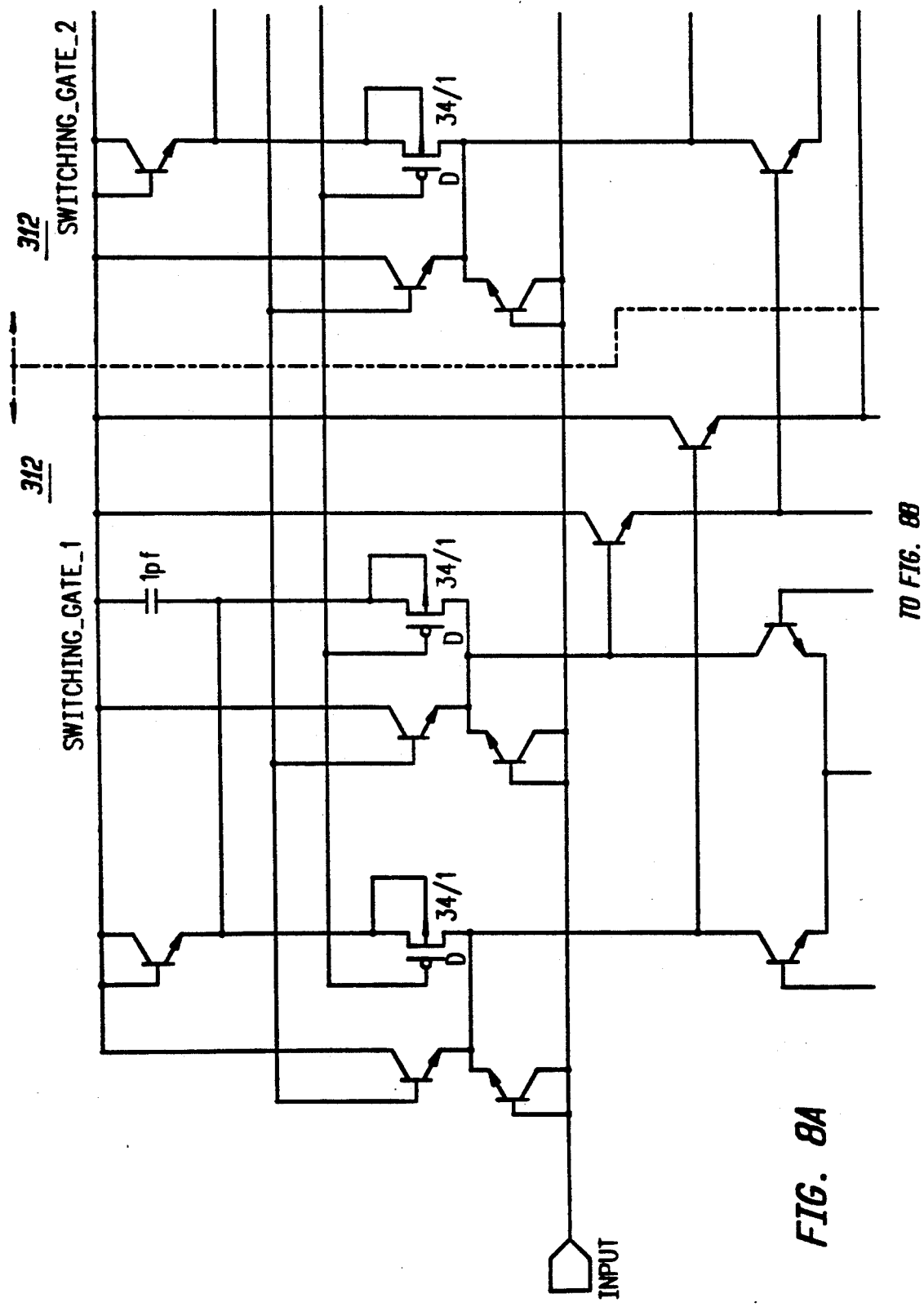
Figure 8B:
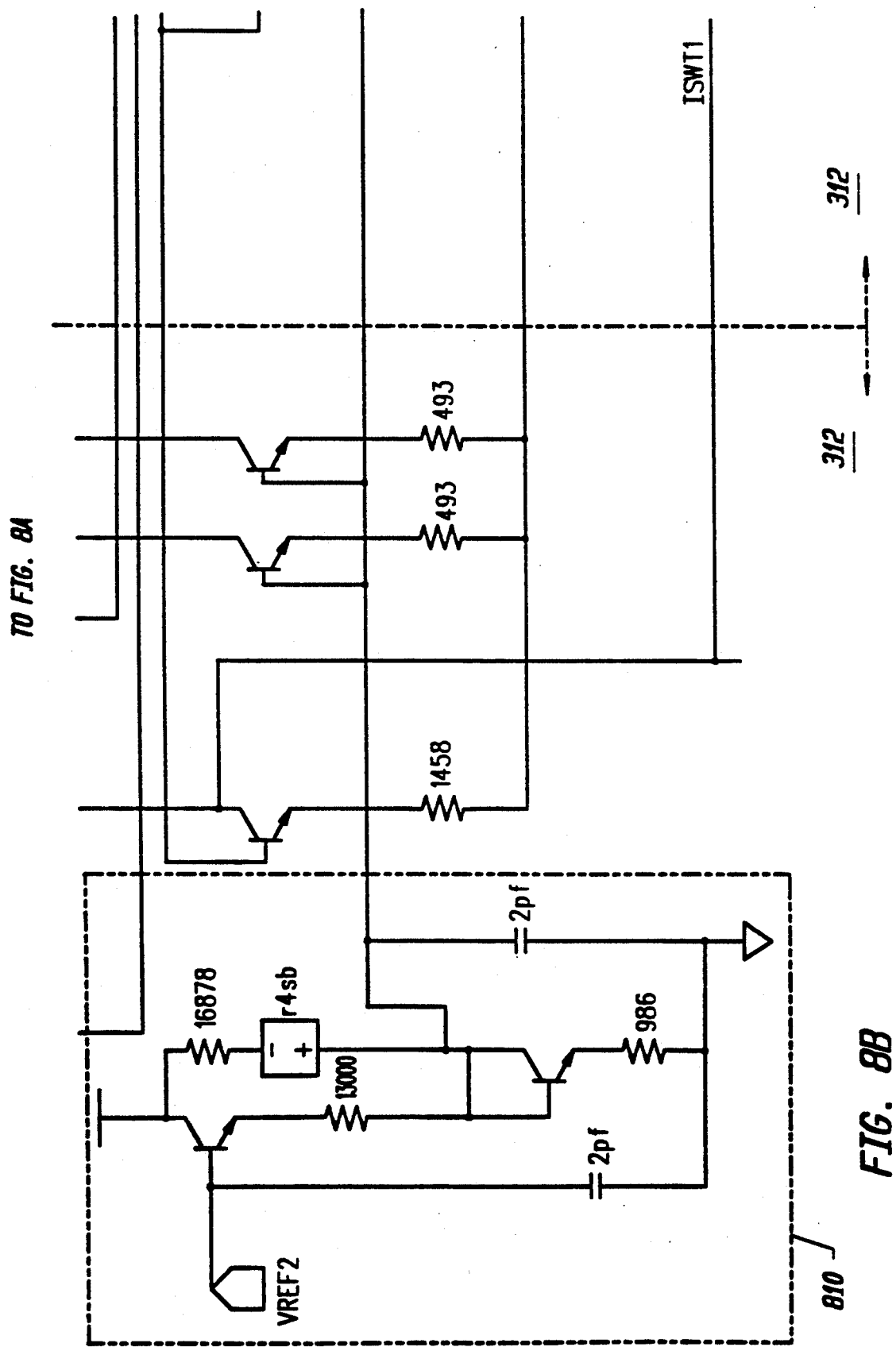
Figure 8D:
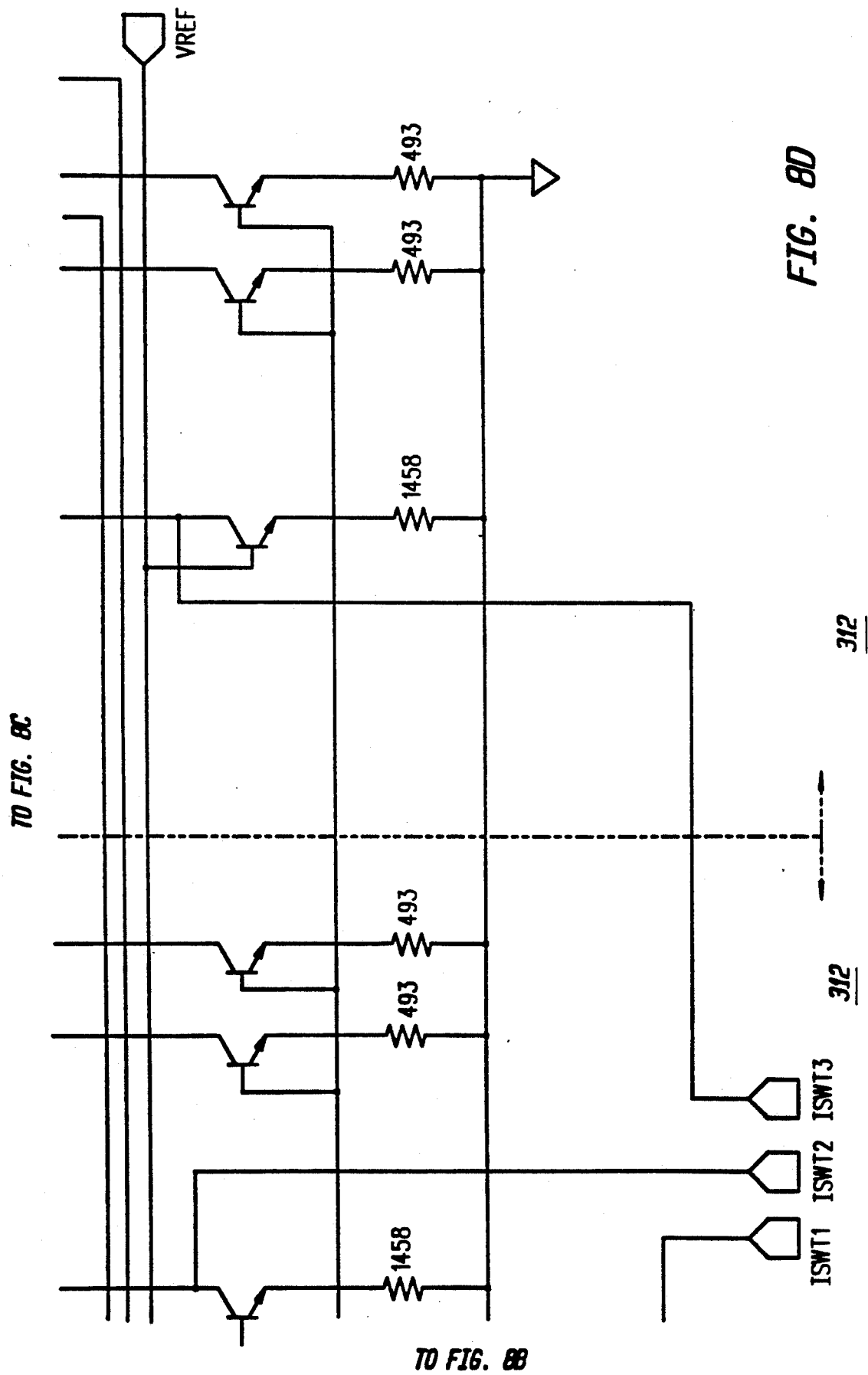

Schematic diagrams of a portion of oscillator stages 318, 320, and 322 of the preferred embodiment are shown in FIGS. 8A, 8B, 8C, and 8D. In addition, a bias circuit 810 for the emitter-follower output stage of oscillator stages 318, 320, and 322 are shown in FIG. 8B. Further, a partial start-up circuit 812, which keeps VCO 110 deenergized until power supply VCC has reached approximately 4 volts, is shown in FIG. 8C.

As stated above, by properly biasing first p-channel FETs P1 and P2, five different resistor values and, therefore, five different voltage drops and, therefore, five different oscillator frequencies may be generated. The first p-channel FETs P1 and P2 are biased by controlling source-to-drain voltage VSD and gate-to-source voltage VGS. Source-to-drain voltage VSD and gate-to-source voltage VGS are controlled by VGS and VSW generator circuit 310.

Figure 9:
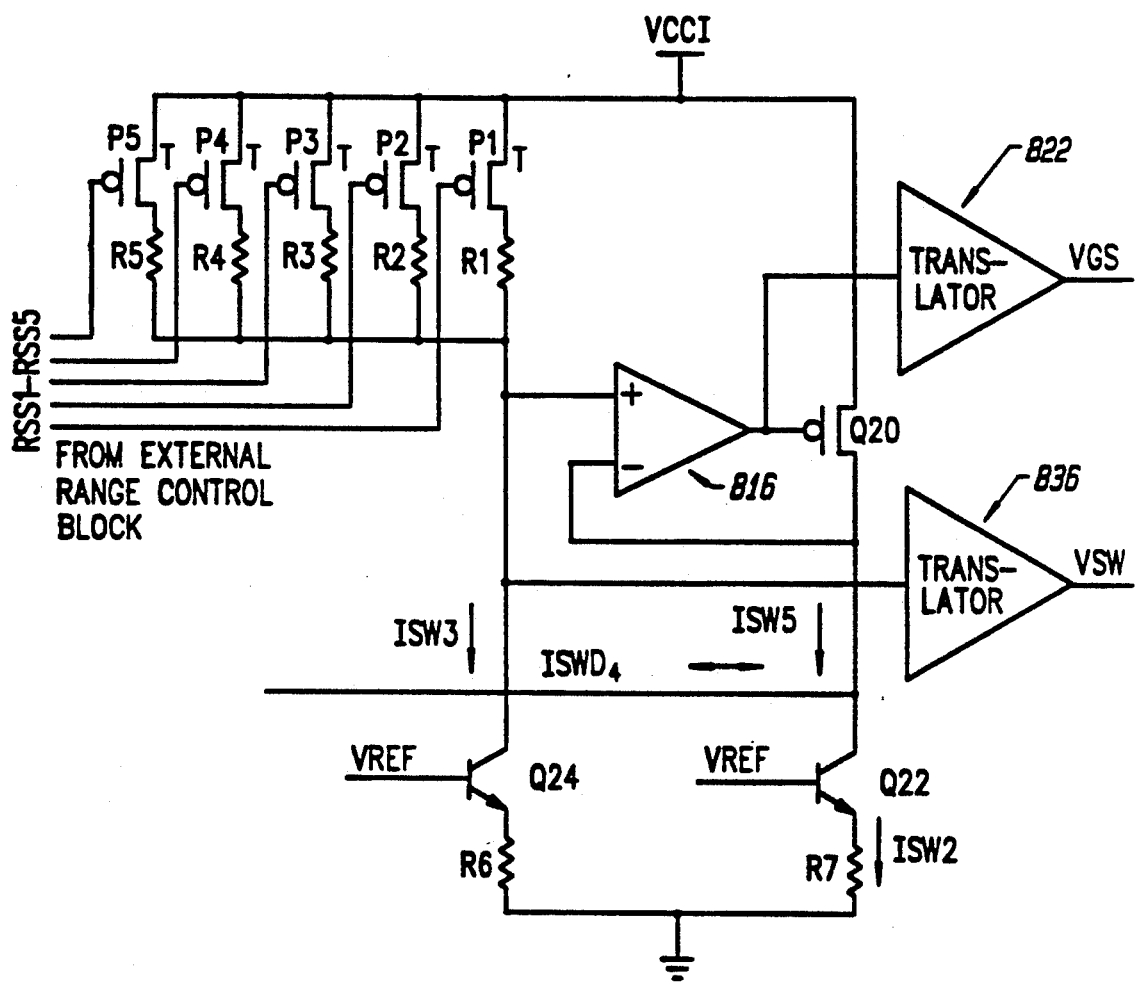
FIG. 9 is a schematic diagram illustrating a VGS and VSW generation circuit utilizable in the voltage controlled oscillator shown in FIG. 5.

FIG. 9 shows VGS and VSW generator circuit 310 of the present invention. As shown in FIG. 9, the gate of a second p-channel FET Q20 is connected to the gate of first FETs P1 and P2 through a VGS translator circuit 822. In addition, the drain of second FET Q20 is connected to the drain of first FETs P1 and P2 through an operational amplifier 816 and a VSW translator circuit 836.

Thus, at 40 degrees celsius, the gate-to-source voltage, the source-to-drain voltage, and a second current ISW2, which is pulled through second FET Q20 when a delta temperature current ISWD4 is equal to zero (see below), are equivalent to the gate-to-source voltage, the source-to-drain voltage, and fixed current ISW, which is pulled through first FETs P1 and P2 when delta temperature current ISWD4 is equal to zero. Therefore, by setting the gate-to-source voltage, the source-to-drain voltage, and second current ISW2 of second FET Q20, the gate-to-source voltage, the source-to-drain voltage, and fixed current ISW of first FETs P1 and P2 will also be set.

The source-to-drain voltage across second FET Q20 is set by the switch voltage VSW and the operation of operational amplifier 816. Switch voltage VSW is equivalent to the voltage drop across one of five oscillator select transistors TP1-TP5 and its corresponding switch resistor R1-R5.

Each oscillator select transistor TP1-TP5, having a source connected to internal power supply VCC1, having a drain connected to its corresponding switch resistor R1-R5, and having a gate connected to shift register 122 (see FIG. 1), provides a current path for a third current ISW3 when the oscillator select transistor TP1-TP5 is selected.

Third current ISW3 is generated by a third npn current source transistor Q24, which is matched to first current source transistor Q50, having a collector connected to each switching resistor R1-R5, having a base connected to reference voltage VREF, and having an emitter connected to ground through a third current resistor R6.

In operation, one of the five range select signals RSS0-RSS4 turns on a corresponding oscillator select transistor TP1-TP5, thereby producing a current path for third current ISW3 and a voltage drop across the oscillator select transistor TP1-TP5 and its associated switch resistor R1-R5.

The operational amplifier 816, having a non-inverting input connected to switching voltage VSW and having an inverting input connected to the drain of second FET Q20, forces the source-to-drain voltage of second FET Q20 to assume switching voltage VSW by the feedback operation of operational amplifier 816.

By forcing the source-to-drain voltage to be equivalent to switching voltage VSW, switching voltage VSW is equivalent to the source-to-drain voltage VSD across second FET Q20.

The gate-to-source voltage across second FET Q20, having a source connected to internal power supply VCC1, having a drain connected to the inverting input of an operational amplifier 816 and a collector of a second current source transistor Q22, and having a gate connected to the output of an operational amplifier 816 and a gate-source translator circuit 822, is set by a second current ISW2 and the operation of operational amplifier 816.

A second npn current source transistor Q22, having a collector connected to the drain of second FET Q20, having a base connected to a reference voltage VREF, and having an emitter connected to ground through a second current resistor R7, sources second current ISW2 which is substantially equivalent to 90% of fixed current ISW sourced by first current source transistor Q50.

Operational amplifier 816 forces the gate-to-source voltage to a voltage which will provide second current ISW2 at a source-to-drain voltage which is equivalent to switching voltage VSW.

VGS and VSW generator circuit 310 may utilize an internal power supply VCC1 of approximately 3 volts, which is different from power supply VCC, to reduce power supply noise coupling into operational amplifier 816. VGS translator circuit 822 and VSW translator circuit 836 are provided to translate back from internal power supply VCC1 referenced levels to levels referenced to power supply VCC, which are what are required by VCO 110.

Figure 10:
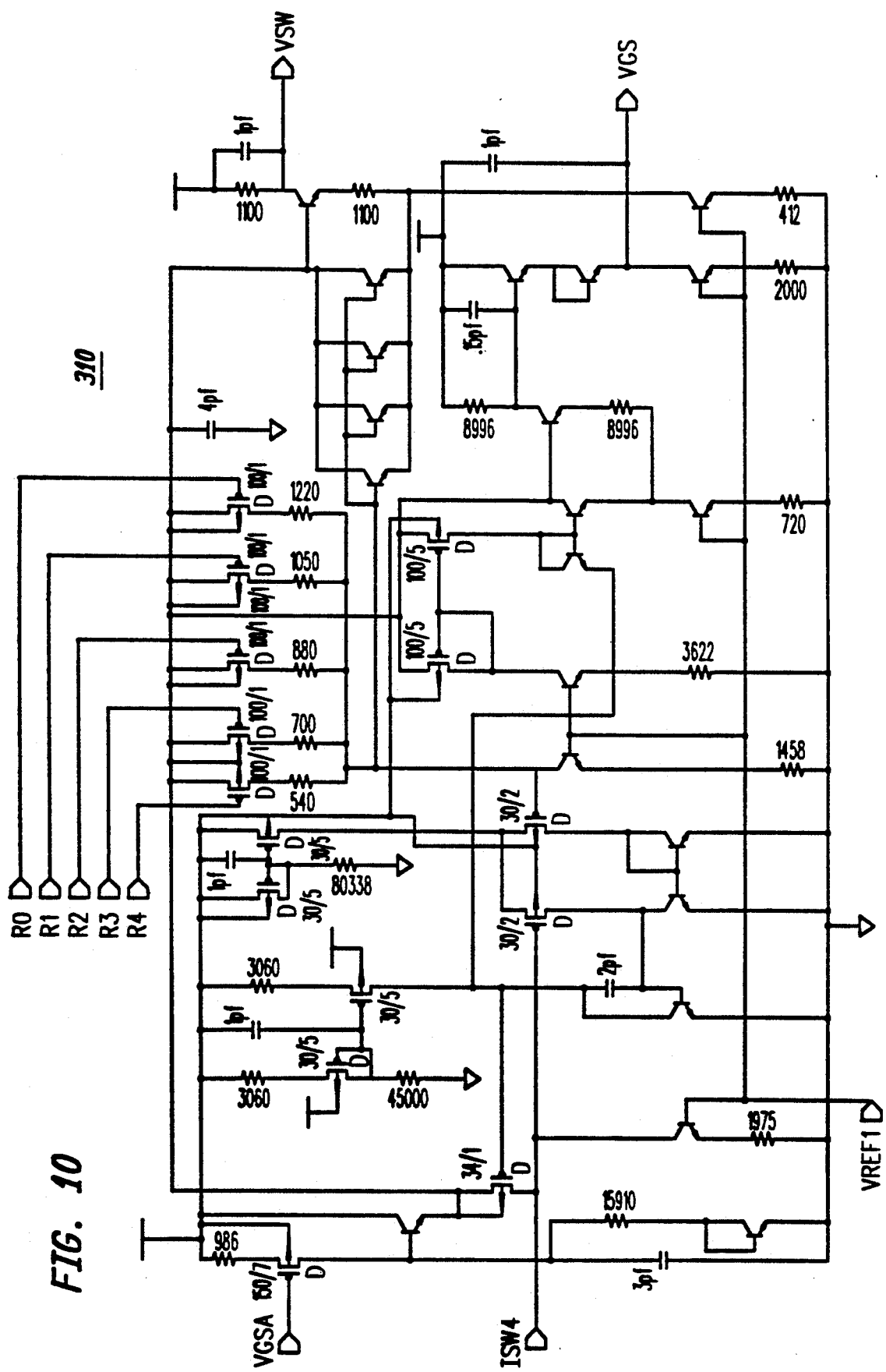
FIG. 10 is a schematic diagram illustrating an embodiment of three FIG. 9 VGS and VSW generator circuit.

VGS and VSW generator circuit 310 of the preferred embodiment of the present invention is shown in FIG. 10.

The above description describes the operation of the VCO at +40 degrees celsius. As temperature varies, however, the slew rate and, therefore, the frequency of oscillator output signal OSC, will also vary due to a linear change in the capacitance of all the transistors. As temperature increases and decreases, the capacitance of varactors Q12a and Q12b increases and decreases, respectively. As the capacitance increases and decreases, the switching speed of oscillator stages 318, 320, and 322 decreases and increases. To maintain a constant switching speed, the current flowing through the switching transistors must be increased or decreased depending on the temperature shift.

Thus, to achieve a nearly constant slew rate over changes in the surrounding temperature from −55 degrees celsius to +125 degrees celsius, the fixed, second, and third currents ISW, ISW2, and ISW3 are made to be substantially independent of the surrounding temperature and a delta temperature current is generated so that more or less current can be pulled through switching transistors 618a and 618b when the capacitance increases and decreases, respectively.

Referring again to FIG. 5, VCO 110 of the present invention generates the fixed, second, and third currents ISW, ISW2, and ISW3 to be substantially independent of changes in the surrounding temperature by utilizing a voltage translator circuit 316 to generate reference voltage VREF which in turn generates the fixed, second, and third currents ISW, ISW2, and ISW3. In addition, voltage translator circuit 316 generates a temperature independent current IREF which is substantially temperature-independent, depending only on the P+ sheet rho.

Voltage translator circuit 316 generates voltage reference signal VREF in response to a temperature independent voltage of 1.35 volts and changes in the surrounding temperature. Voltage reference signal VREF is generated so that as the surrounding temperature rises and falls, voltage reference signal VREF decreases and increases, respectively, by a compensating amount so that the fixed, second, and third currents ISW, ISW2, and ISW3 may be constant.

The fixed, second, and third currents ISW, ISW2, and ISW3, however, remain dependent on the linear variation of the P+ sheet rho (90 ohm/sq). Since this dependency is small, the fixed, second, and third currents ISW, ISW2, and ISW3, to a first order, are independent of changes in the surrounding temperature.

Figure 11:
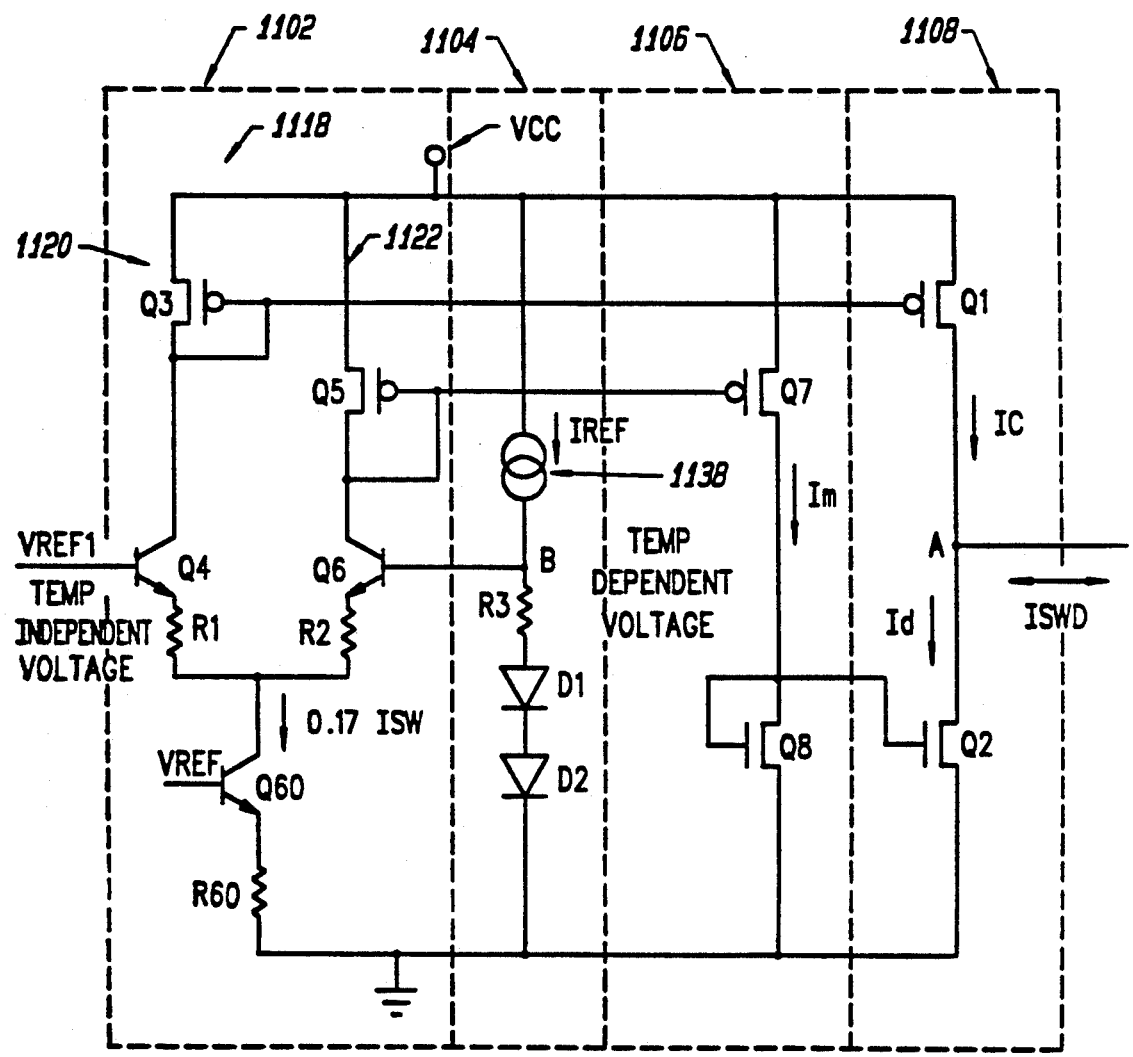
FIG. 11 is a schematic diagram illustrating a temperature compensation circuit utilizable in the voltage controlled oscillator shown in FIG. 5.
Figure 12A:
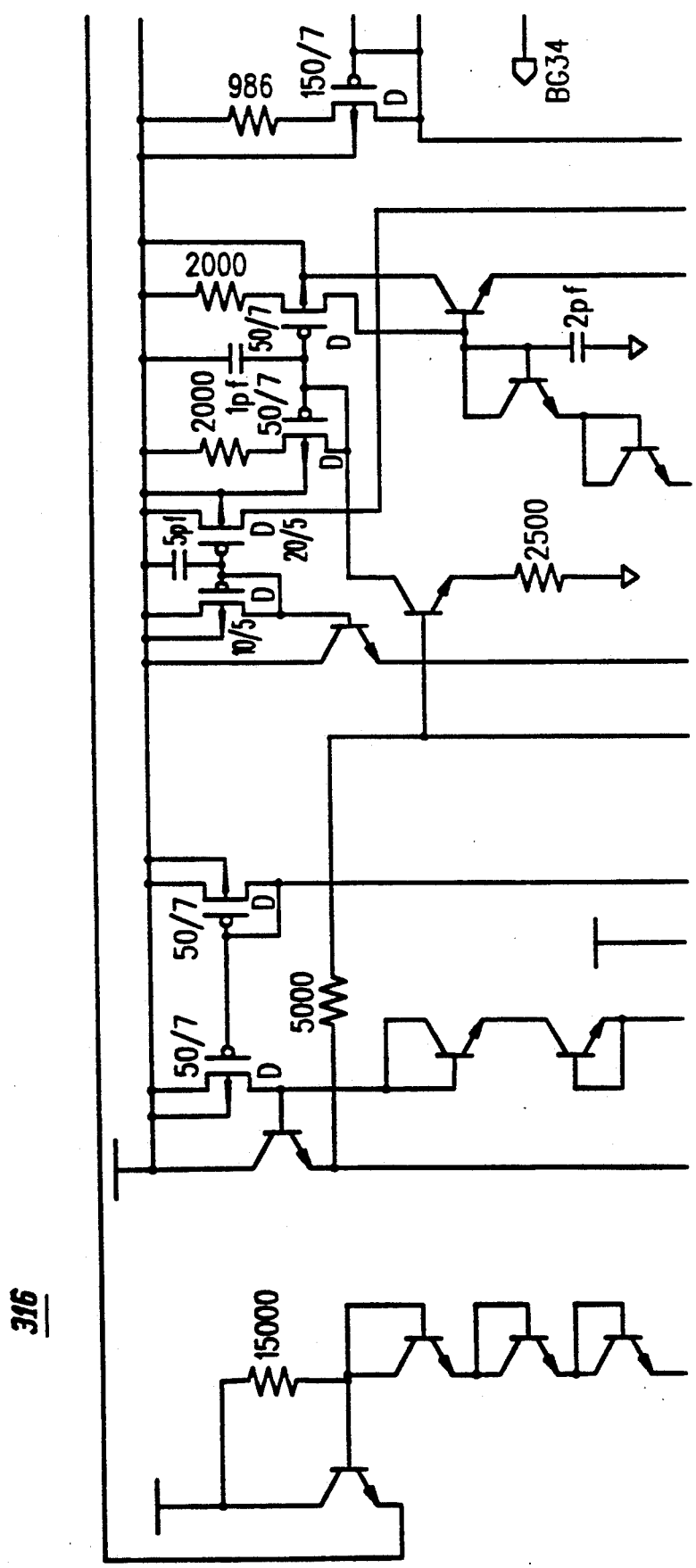
FIGS. 12A and 12B are schematic diagrams illustrating a portion of an embodiment of the voltage translator circuit.
Figure 12B:
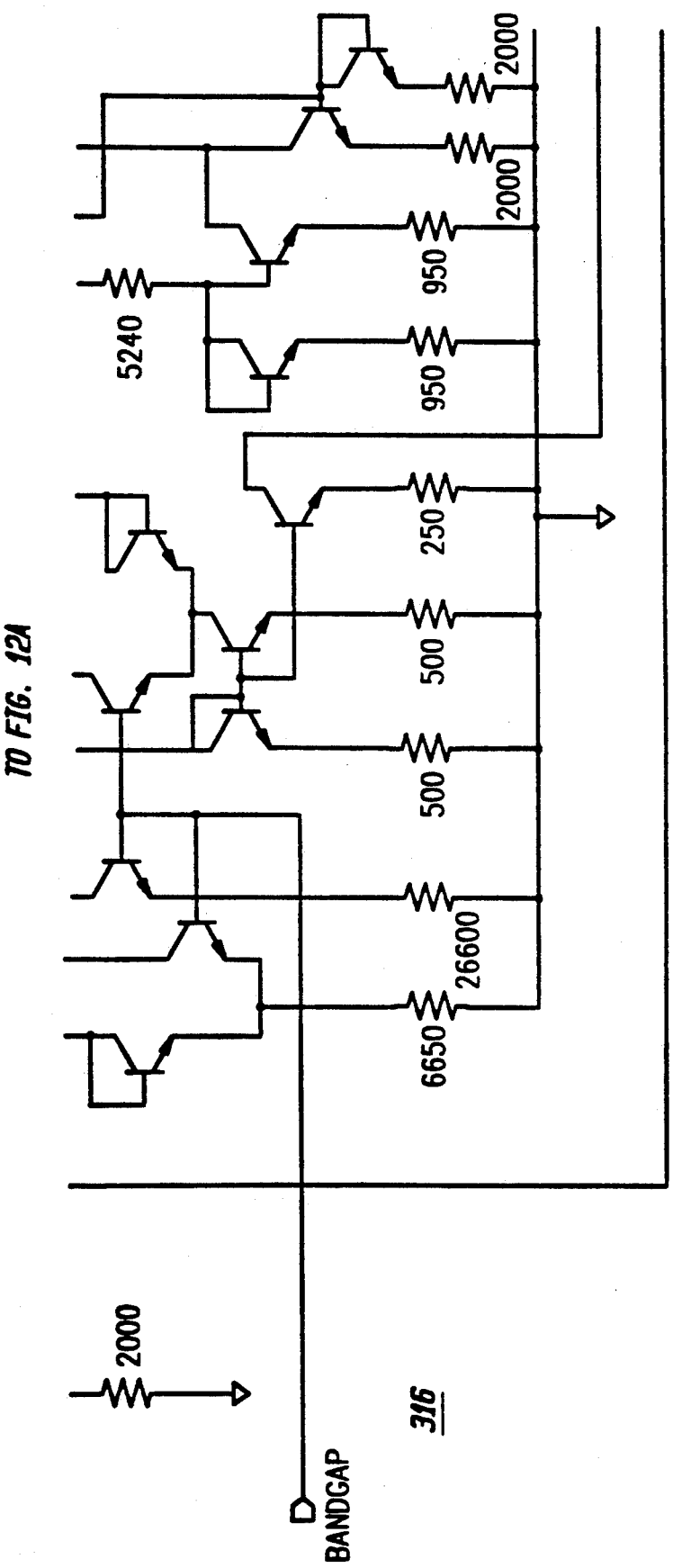
Figure 12C:
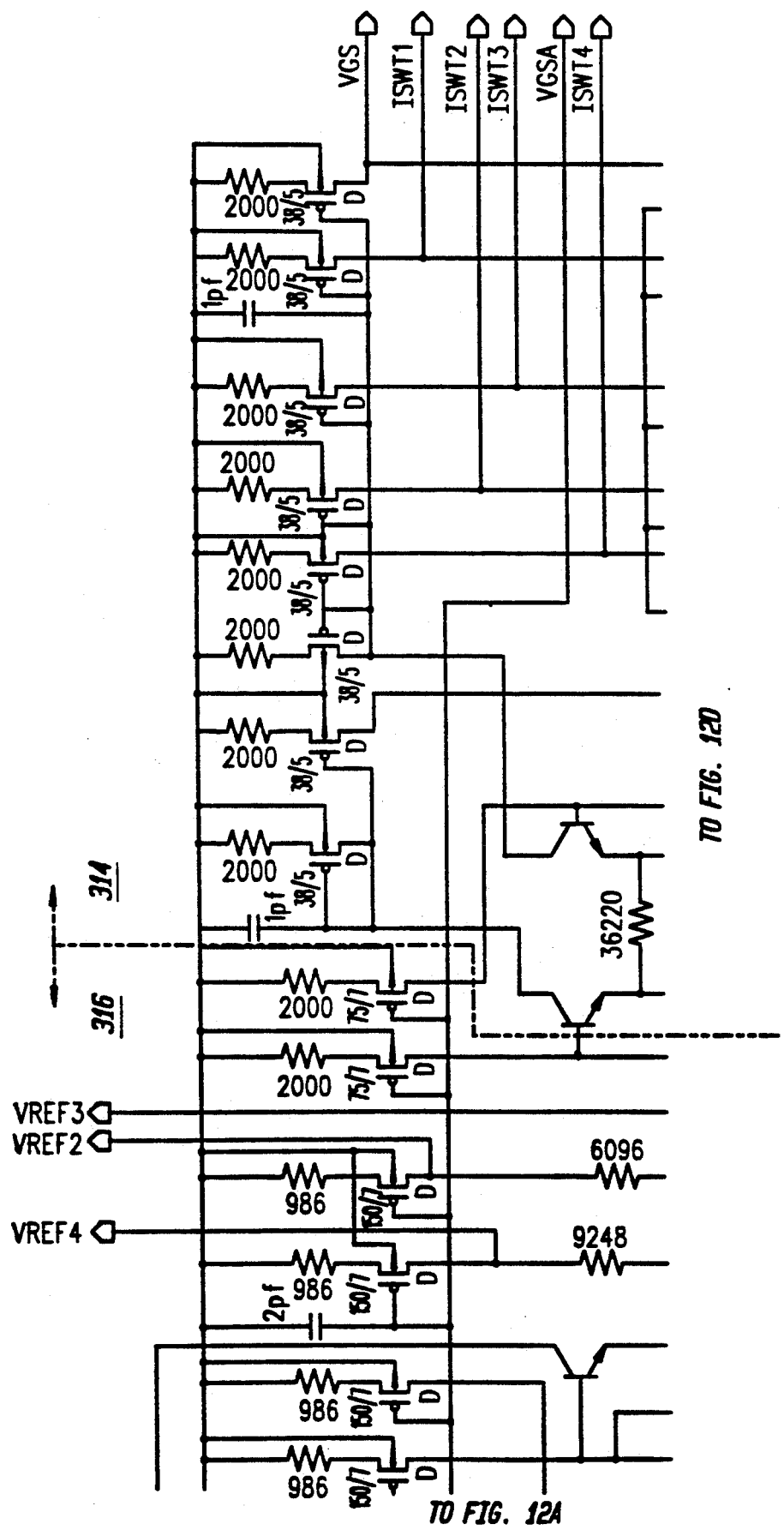
FIGS. 12C and 12D are schematic diagrams illustrating a portion of an embodiment of the voltage translator circuit and the FIG. 11 temperature compensation circuit.
Figure 12D:
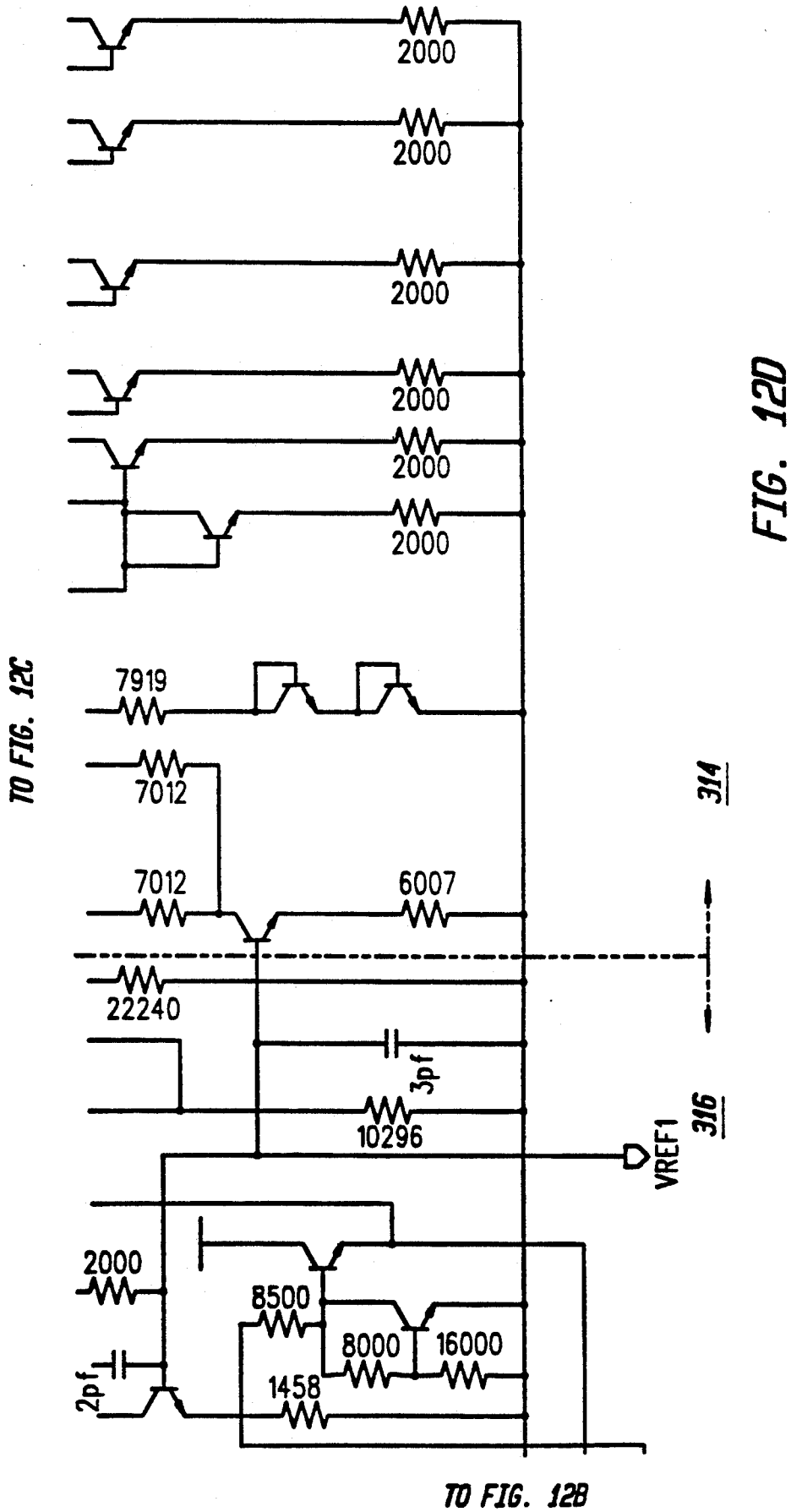

Referring to FIG. 11, VCO of the present invention pulls more or less current through switching transistors 618a and 618b when the capacitance increases and decreases, respectively, by utilizing a temperature compensation circuit 314.

Temperature compensation circuit 314 includes an input stage 1102 that receives a temperature independent and dependent voltage, a temperature dependent stage 1104 for generating the temperature dependent voltage, a discharging stage 1106 for varying a discharge current Id as the surrounding temperature changes, and an output stage 1108 for generating a delta temperature current Iswd.

As shown in FIG. 11, in a preferred embodiment of the present invention, the input stage 1102 is configured as a compensating differential pair 1118. The compensating differential pair 1118 includes a charging leg 1120 and a discharging leg 1122, each of which provides a current path for a portion of a fixed current 0.17ISW from a power supply VCC to a charging current source transistor Q60.

Charging leg 1120 includes a p-channel charging transistor Q3, having a source connected to power supply VCC, and a npn charging input transistor Q4, having a collector connected to the gate and drain of charging transistor Q3, having a base connected to a temperature independent bandgap voltage VREF1 of approximately 2.5 volts, and having an emitter connected to the collector of charging current source transistor Q60 through a charging input resistor R1.

Discharging leg 1118 includes a p-channel discharging transistor Q5, having a source connected to power supply VCC, and a discharging input transistor Q6, having a collector connected to the gate and drain of discharging transistor Q5, having a base connected to a temperature dependent node B, and having an emitter connected to the collector of charging current source transistor Q60 through a discharging input resistor R2.

Charging current source transistor Q60, having its base connected to the reference voltage VREF and having its emitter connected to ground through charging resistor R60, generates fixed current 0.17ISW, which is substantially temperature-independent, to be approximately 17% of fixed current ISW by increasing the value of the charging resistor R60 in relation to resistor R50 of FIG. 7.

As shown in FIG. 11, when charging input transistor Q4 has approximately 2.5 volts at its base and discharging input transistor Q6 has approximately 2.5 volts at its base, charging input transistor Q4 along with charging transistor Q3 and discharging input transistor Q6 along with discharging transistor Q5, source approximately an equivalent portion of the fixed current 0.17ISW.

On the other hand, as the temperature changes, the voltage on the base of discharging input transistor Q6 changes, thereby changing the proportion of the fixed current 0.17ISW which is sourced by charging input transistor Q4 and discharging input transistor Q6.

Temperature dependent stage 1104 varies the voltage at temperature dependent node B and the base of discharging input transistor Q6 as temperature varies. Temperature dependent node B is connected to ground through a series connection of a dependent resistor R3, a first diode D1, and a second diode D2, and to power supply VCC through an independent current source 1138. Independent current source 1138 sources temperature independent current IREF which is derived from voltage translator circuit 316.

As temperature varies, the voltage drop across first diode D1 and second diode D2 will vary causing the voltage at temperature dependent node B and the base of discharging input transistor Q6 to vary. As the voltage at the base of discharging input transistor Q6 varies, the proportion of the fixed current 0.17ISW sourced by charging input transistor Q4 and discharging input transistor Q6 changes. Thus, as the temperature changes, the portion of the fixed current 0.17ISW sourced by charging input transistor Q4 and discharging input transistor Q6 changes.

Output stage 1108 generates delta temperature current Iswd as a summation of a charging current Ic and discharging current Id. Charging current Ic is generated by a p-channel charging output transistor Q1.

Charging output transistor Q1, having a source connected to power supply VCC, having a gate connected to the gate and the drain of charging transistor Q3, and having a drain connected to a delta temperature node A, generates charging current Ic by connecting its gate to the gate of charging transistor Q3.

By connecting gates together, charging transistor Q3 and charging output transistor Q1 have substantially equivalent gate-to-source voltages. Thus, when the source-to-drain voltage of charging transistor Q3 becomes positive and charging transistor Q3 begins to conduct, charging output transistor Q1 will also begin to conduct.

N-channel discharging output transistor Q2, having a drain connected to delta temperature node A and having a source connected to ground, generates discharge current Id by mirroring an intermediate current Im.

Intermediate current Im is generated by the discharging stage. P-channel conversion transistor Q7, having a source connected to power supply VCC, having a gate connected to the gate and drain of discharging transistor Q5, generates intermediate current Im by connecting its gate to the gate of discharging transistor Q5.

By connecting gates together, discharging transistor Q5 and conversion transistor Q7 have substantially equivalent gate-to-source voltages. Thus, when the source-to-drain voltage of discharging transistor Q5 becomes positive and discharging transistor Q5 begins to conduct, conversion transistor Q7 will also begin to conduct.

A n-channel output transistor Q8, whose drain and gate are connected to the drain of conversion transistor Q7 and the gate of discharging output transistor Q2, and whose source is connected to ground, conducts intermediate current Im.

Discharging output transistor Q2 generates discharge current Id by connecting its gate to the gate of output transistor Q8. By connecting gates together, output transistor Q8 and discharging output transistor Q2 have substantially equivalent gate-to-source voltages. Thus, when the source-to-drain voltage of output transistor Q3 becomes positive and output transistor Q3 begins to conduct, discharging output transistor Q2 will also begin to conduct.

In operation, at +40 degree celsius, charging output transistor Q1 sources a charging current Ic which is identical to discharging current Id which is sourced by discharging output transistor Q2. Thus, at +40 degrees celsius, discharging output transistor Q2 sinks all of the current generated by charging output transistor Q1.

As temperature changes, however, compensating differential pair 1118 indirectly causes charging output transistor Q1 and discharging output transistor Q2 to source different amounts of charging current Ic and discharging current Id, respectively. When discharging current Id is less than charging charging current Ic, delta temperature node A effectively sources a delta temperature current Iswd which is equivalent to the difference between charging current Ic and discharging current Id.

Similarly, when discharging current Id is greater than charging current Ic, delta temperature node A effectively sinks a delta temperature current Iswd current by drawing the needed current from VGS and VSW generator circuit 310 and each oscillator stage 318, 320, 322.

In the preferred embodiment of the present invention, four output stages are electrically connected in parallel to produce four equivalent delta temperature currents ISWD1-4 (see FIG. 5).

The fixed current 0.17ISW is selected to be approximately 17% of the nearly constant fixed current ISW. In order to accurately compensate for the variation in capacitance with temperature over the range −55 degrees celsius to +125 degrees celsius centered around +40 degrees celsius, it was determined that temperature compensation circuit 314 should implement the equation $$Iswd = (ISW)(T-To)(1.7e\text{-}3)$$

where To = +40 degrees celsius.

A portion of voltage translator circuit 316 and the temperature compensation circuit 314 of the preferred embodiment of the present invention are shown in FIGS. 12A, 12B, 12C, and 12D.

Referring again to FIG. 7, as stated above, first current source transistor Q50 sinks a fixed current ISW through switching transistors 618a and 618b independent of temperature. As temperature and therefore capacitance rises, the delta temperature current sinks an additional current which, when combined with fixed current ISW, forms a larger first current ISW1. This larger current is sufficient to compensate for the larger capacitance and thereby maintains a constant slew rate. Referring to the equation $$\frac{dv}{dt} = \frac{ISW1}{C_i}$$

if C increases with temperature in a linear manner, then in order to keep dv/dt constant, ISW1 must also increase in the same linear manner with temperature.

By sinking first current ISW1 through switching transistors 618a and 618b, a potentially greater source-to-drain voltage drop could be created across first p-channel FETs P1 and P2. However, referring to FIG. 9, the product of third current ISW3 and the selected switch resistor R1-R5 is substantially independent of temperature. This sets the switching voltage to be substantially independent of temperature and therefore, due to the feedback operation of operational amplifier 816, sets the source-to-drain voltage to be substantially independent of temperature.

As stated above, second current ISW2, which is also substantially independent of temperature, sets the gate-to-source voltage of second p-channel FET Q20. As temperature rises, delta temperature current ISWD sinks an identical additional current which, when combined with second current ISW2, forms a larger fifth current ISW5.

By pulling a larger fifth current ISW5 through second FET Q20, the feedback action of the operational amplifier changes the gate-to-source voltage of second FET Q20. As stated above, this then changes the gate-to-source voltage of first FETs P1 and P2 so that the voltage drop across first FETs P1 and P2 remains constant with the increased first current ISW1 being pulled through first FETs P1 and p2.

Similarly, as the temperature decreases, delta temperature current ISWD sources an additional current resulting in first current ISW1 and fifth current ISW5 being reduced.

It should be understood that various alternatives to the structures described herein may be employed in practicing the present invention. It is intended that the following claims define the invention and that the structure within the scope of these claims and their equivalents be covered thereby.

What is claimed is:

1. A voltage controlled oscillator for generating an oscillator output signal which is independent of changes in surrounding temperature, the voltage controlled oscillator comprising:

a plurality of inverter elements connected in series in a ring configuration such that each inverter element generates an oscillator signal in response to an oscillator signal provided by the previous inverter element in the series, each inverter element also being responsive to a first reference voltage, a delta temperature current provided from a plurality of delta temperature currents, a first bias voltage, and a second bias voltage, the frequency of the oscillator signal provided by each inverter element varying in response to a loop filter voltage provided to the inverter element;

voltage translator means for generating the first reference voltage and a second reference voltage in response to a temperature independent bandgap voltage;

voltage generation means for generating the first bias voltage and the second bias voltage in response to one of a plurality of range select signals, the first reference voltage, and one of the plurality of delta temperature currents; and temperature compensation means for sourcing and sinking the plurality of delta temperature currents in response to the second reference voltage.

2. The voltage controlled oscillator element of claim 1 wherein each inverter circuit comprises:

a plurality of variable resistive means for generating a first voltage across each variable resistive means when a fixed current flows through the variable resistive means and for generating a second voltage across each variable resistive means when the fixed current does not flow through the variable resistive means, each variable resistive means being set to a resistive value in response to the first bias voltage and the second bias voltage, and being connected to a power supply;

a plurality of variable capacitive means having a variable capacitance associated therewith, one such variable capacitive means being associated with a corresponding one of the variable resistive means, the variable capacitance of each variable capacitance means being set by the loop filter voltage and either the first voltage or the second voltage across the corresponding variable resistive means;

a plurality of switching transistor means, one such switching means being connected to a corresponding one of the plurality of variable resistive means, for alternately selecting one of the plurality of resistive means; and current source means connected to each of the plurality of switching transistor means and to ground for generating the fixed current.

3. The voltage controlled oscillator circuit of claim 2 wherein the variable resistive means comprises a transistor operating in the linear region.

4. The voltage controlled oscillator circuit of claim 3 wherein the variable capacitive means comprises a reverse-biased transistor.

5. The voltage controlled oscillator circuit of claim 2 wherein the current source means includes means for generating a substantially temperature-independent fixed current in response to the first reference voltage.

6. The voltage controlled oscillator circuit of claim 5 wherein the temperature compensation means includes means for sinking the delta temperature current away from an input of the current source means when temperature increases above a fixed temperature and means for sourcing the delta temperature current to the input of the current source means when the surrounding temperature decreases below the fixed temperature.

* * * * *